(12) United States Patent
Ogasawara et al.

(10) Patent No.: US 9,223,161 B2
(45) Date of Patent: Dec. 29, 2015

(54) DISPLAY DEVICE

(71) Applicant: Sharp Kabushiki Kaisha, Osaka-shi, Osaka (JP)

(72) Inventors: Isao Ogasawara, Osaka (JP); Masahiro Yoshida, Osaka (JP); Satoshi Horiuchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/389,814

(22) PCT Filed: Feb. 6, 2013

(86) PCT No.: PCT/JP2013/052672
§ 371 (c)(1),
(2) Date: Oct. 1, 2014

(87) PCT Pub. No.: WO2013/157285
PCT Pub. Date: Oct. 24, 2013

(65) Prior Publication Data
US 2015/0070616 A1    Mar. 12, 2015

(30) Foreign Application Priority Data

Apr. 20, 2012  (JP) ................. 2012-097124

(51) Int. Cl.
*G02F 1/133* (2006.01)
*G02F 1/1339* (2006.01)
(Continued)

(52) U.S. Cl.
CPC .......... *G02F 1/13306* (2013.01); *G02F 1/1339* (2013.01); *G02F 1/1341* (2013.01);
(Continued)

(58) Field of Classification Search
CPC ............ G02F 1/13306; G02F 1/13452; G02F 1/1341; G02F 1/1368; G02F 1/136286; G02F 1/13454; G02F 1/1309; G09G 3/3648; G09G 3/3677; G09G 2300/0426; G09G 2300/0408; H01L 51/524; H01L 27/3276

See application file for complete search history.

(56) References Cited

U.S. PATENT DOCUMENTS 3,967,253 A * 6/1976 Tsuruishi ................ G02F 1/055
                                                      345/100
5,006,840 A * 4/1991 Hamada .............. G02F 1/13306
                                                      345/88

(Continued)

FOREIGN PATENT DOCUMENTS

JP    2005-522734 A    7/2005
JP    2006-039524 A    2/2006

(Continued)

*Primary Examiner* — Anne Hines
(74) *Attorney, Agent, or Firm* — Keating & Bennett, LLP

(57) ABSTRACT

The present invention provides a display device in which a seal is easily inspected. The present invention provides a display device including: a first substrate; a second substrate; and a seal, wherein the first substrate includes a shift register monolithically formed on an insulating substrate, and a plurality of bus lines, the shift register includes a plurality of cascade-connected unit circuits, the plurality of unit circuits each include a clock terminal, an output, an output transistor having one of a source and a drain connected to the clock terminal and the other of the source and the drain connected to the output terminal, and a bootstrap capacitor having a first terminal connected to a gate of the output transistor and a second terminal connected to the output terminal, the output capacitor includes a first electrode, an insulating layer on the first electrode, and a second electrode on the insulating layer, the first electrode is provided with at least one of a first cutout and a first opening, and the second electrode is provided with at least one of a second cutout and a second opening facing the at least one of the first cutout and the first opening.

11 Claims, 22 Drawing Sheets

(51) Int. Cl.
*H01L 51/52* (2006.01)
*H01L 27/32* (2006.01)
*G02F 1/1345* (2006.01)
*G09G 3/36* (2006.01)
*G02F 1/1341* (2006.01)
*G02F 1/1362* (2006.01)
*G02F 1/1368* (2006.01)
*G02F 1/13* (2006.01)

(52) U.S. Cl.
CPC .......... *G02F1/1368* (2013.01); *G02F 1/13452* (2013.01); *G02F 1/13454* (2013.01); *G02F 1/136286* (2013.01); *G09G 3/3648* (2013.01); *G09G 3/3677* (2013.01); *H01L 27/3276* (2013.01); *H01L 51/524* (2013.01); *G02F 1/1309* (2013.01); *G09G 2300/0408* (2013.01); *G09G 2300/0426* (2013.01); *G09G 2300/08* (2013.01)

(56) References Cited

U.S. PATENT DOCUMENTS

| | | | |
|---|---|---|---|
| 8,902,144 B2* | 12/2014 | Umezaki | G09G 3/3413 345/100 |
| 2003/0189542 A1 | 10/2003 | Lee et al. | |
| 2006/0022201 A1 | 2/2006 | Kim et al. | |
| 2006/0056267 A1 | 3/2006 | Kim et al. | |
| 2006/0161693 A1 | 7/2006 | Lee et al. | |
| 2008/0018572 A1 | 1/2008 | Shin et al. | |
| 2008/0284698 A1 | 11/2008 | Lee et al. | |
| 2009/0303427 A1 | 12/2009 | Kondo et al. | |
| 2010/0141622 A1 | 6/2010 | Kim et al. | |
| 2010/0182226 A1* | 7/2010 | Umezaki | G02F 1/13454 345/98 |
| 2011/0012880 A1 | 1/2011 | Tanaka et al. | |
| 2012/0032615 A1 | 2/2012 | Kikuchi et al. | |
| 2012/0229712 A1 | 9/2012 | Yoshida et al. | |
| 2012/0241747 A1* | 9/2012 | Yamasaki | G09G 3/3677 257/59 |
| 2012/0249502 A1* | 10/2012 | Takahashi | G09G 3/3677 345/205 |
| 2013/0039455 A1 | 2/2013 | Horiuchi et al. | |

FOREIGN PATENT DOCUMENTS

| | | |
|---|---|---|
| JP | 2006-079041 A | 3/2006 |
| JP | 2007-065037 A | 3/2007 |
| JP | 2008-026865 A | 2/2008 |
| WO | 2006/098475 A1 | 9/2006 |
| WO | 2009/150862 A1 | 12/2009 |
| WO | 2010/137197 A1 | 12/2010 |
| WO | 2011/067963 A1 | 6/2011 |
| WO | 2011/135873 A1 | 11/2011 |

* cited by examiner 31a,35a  32a,36a  31,35  32,36

31b,35b  32b,36b  31,35  32,36

31b,35b  32b,36b  31,35  32,36

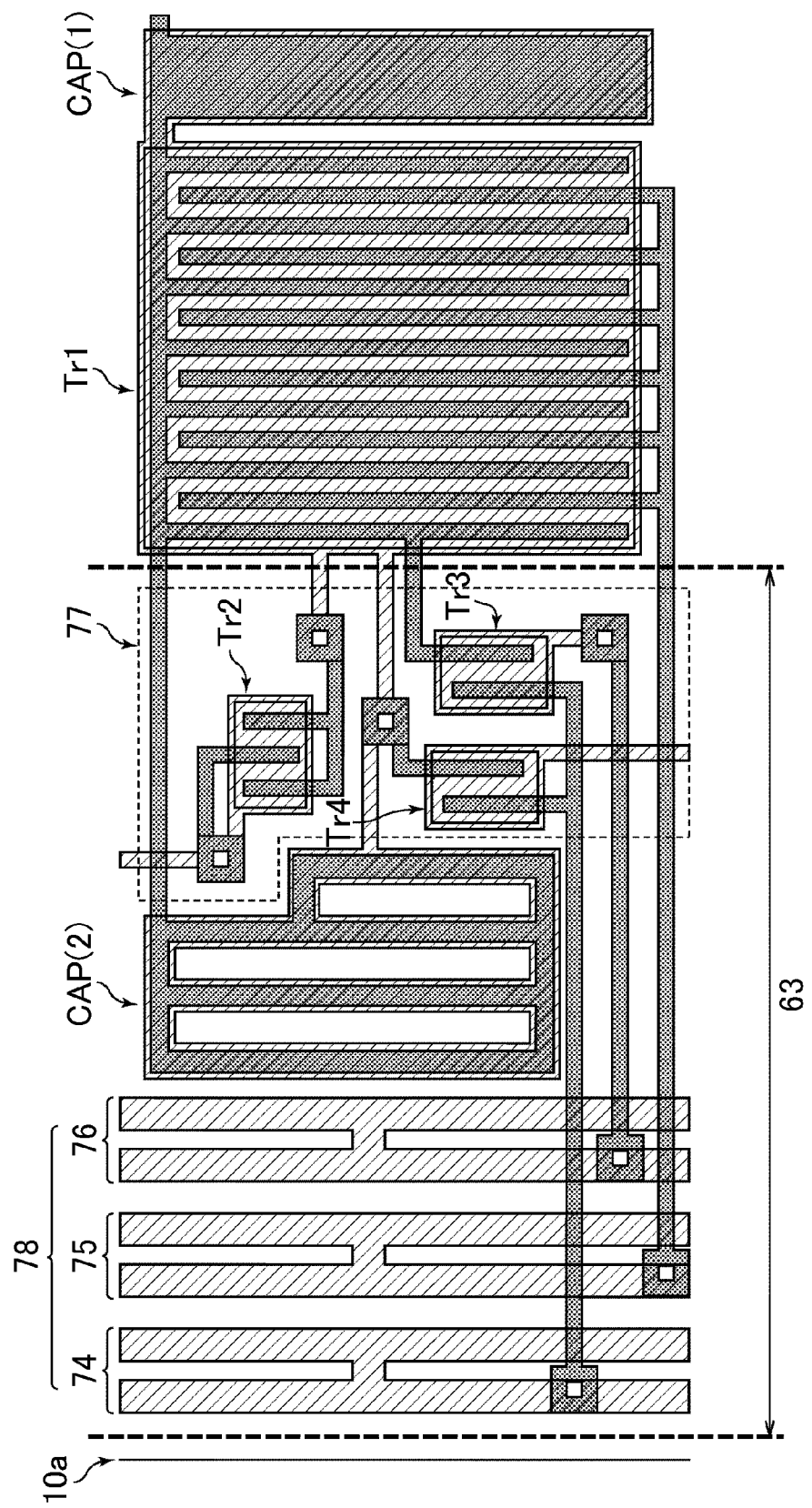

DISPLAY DEVICE

TECHNICAL FIELD

The present invention relates to a display device. More specifically, the present invention relates to a display device suitably used as a display device equipped with a shift register.

BACKGROUND ART

An active-matrix display device (e.g., active-matrix liquid crystal display) commonly display images by selecting pixels arranged in a matrix by the unit of pixel rows and writing a voltage corresponding to the display data into the selected pixels. For the selection of pixels in the unit of pixel rows, a gate bus line-driving circuit (hereafter, also referred to as a gate driver) is provided with a shift register that sequentially shifts an output signal (scanning signal) based on a clock signal.

The process of forming a thin film transistor (TFT) in a pixel may be utilized for forming a gate driver concurrently with the TFT in the pixel. For example, in a case where a TFT in a pixel is formed of amorphous silicon, preferably, a shift register included in a gate driver is also formed of the amorphous silicon for cost reduction. The gate driver may be monolithically formed on an array substrate these days.

Recently, the technique of one drop filling (ODF) has been developed as a method of filling a liquid crystal panel of a liquid crystal display with a liquid crystal material. In the ODF, a step of bonding two substrates and a step of injecting a liquid crystal material between the two substrates can be performed at the same time.

Exemplary techniques related to monolithic formation of a gate driver are mentioned below.

A disclosed device is a display device in which a display panel includes a first substrate provided with a plurality of gate lines and a plurality of data lines, a second substrate facing the first substrate, and a sealing material bonding the first substrate and the second substrate; and a gate driver includes a wiring portion for receiving a plurality of signals from the outside and a circuit portion outputting a driving signal in response to the plurality of signals, the wiring portion being provided with an opening for transmitting light incident through the back face of the first substrate for curing the sealing material (see Patent Literature 1). Patent Literature 1 teaches that the sealing material enhances the bonding power between the first substrate and the second substrate.

A disclosed unit is a driving unit including a circuit portion and a wiring portion, wherein the circuit portion has a plurality of stages cascade-connected to each other and outputs a driving signal in response to a plurality of control signals; the wiring portion has first and second signal wirings for receiving a plurality of control signals from the outside, a first connection wiring connecting the first signal wiring to the plurality of stages, and a second connection wiring connecting the second signal wiring to the plurality of stages; and the first signal wiring and the first and second connection wirings are provided in layers different from a layer of the second signal wiring (see Patent Literature 2).

A disclosed substrate is a display substrate including a gate wiring, a driving circuit portion, a signal wiring portion, a coupling wiring portion, and a contact portion, wherein the gate wiring is formed in a display region and crosses a source wiring; the driving circuit portion is formed in a peripheral region surrounding the display region and outputs a gate signal to the gate wiring; the signal wiring portion is formed adjacent to the driving circuit portion and extending in a running direction of the source wiring, and transmits a driving signal; the coupling wiring portion includes a first end portion overlapping with the signal wiring portion and a second end portion electrically coupled with the driving circuit portion; and the contact portion is formed on the signal wiring portion and electrically connects the first end portion of the coupling wiring portion to the signal wiring portion (see Patent Literature 3).

A disclosed circuit is a driving circuit including a plurality of driving stages and a dummy stage, wherein the plurality of driving stages are cascade-connected to each other by coupling an output terminal of each stage to a control terminal of the previous stage and sequentially outputs a switching element-driving signal to a plurality of driving-signal lines coupled with switching elements formed on pixels arranged in a matrix; and the dummy stage has a dummy output terminal coupled with a control terminal of the final stage, among the plurality of driving stages, and with a dummy control terminal thereof (see Patent Literature 4).

A disclosed device is a liquid crystal display device wherein a conventional first auxiliary capacitor trunk wiring is formed to have a narrower width, and a second auxiliary capacitor trunk wiring is newly provided and arranged at a position closest to the periphery of the substrate (see Patent Literature 5). According to the structure disclosed in the fifth embodiment and FIG. 13 of Patent Literature 5, a second auxiliary capacitor trunk wiring 440 and a DC voltage VSS wiring 420a, which has a largest width among the driving signal supply trunk wirings 420, have a slit-like opening.

A disclosed TFT is a TFT including a first capacitor formed by first and second capacitor electrodes, a second capacitor formed by third and fourth capacitor electrodes, a first lead wire, a second lead wire connected to a gate electrode, a third lead wire, a fourth lead wire, a first wiring, and a second wiring (see Patent Literature 6).

A disclosed shift register is a shift register configured by cascade-connected unit circuits, wherein each of the unit circuits includes an output transistor that is provided between a clock terminal and an output terminal and switches a mode whether or not a clock signal is transmitted in accordance with a gate potential and at least one control register that has one conductive terminal connected to a gate of the output terminal; the gate potential of the output transistor is set to be higher than a high-level potential of the clock signal during a period where the output transistor is ON and the clock signal is at a high level; and the control transistor includes a transistor that has a greater channel length than the output transistor (see Patent Literature 7).

Another disclosed shift register is a shift register including a plurality of cascade-connected shift register stages on a substrate, wherein the shift register stages each have a first transistor equipped with a capacitor electrode that faces at least one of source/drain electrodes in a thickness direction on the opposite side of a gate electrode, and the capacitor electrode and one of the source/drain electrodes facing the capacitor electrode are electrically connected to a control electrode of an output transistor of the shift register stage (see Patent Literature 8).

Disclosures related to one drop filling are mentioned below.

A disclosed liquid crystal display panel is a liquid crystal display panel including a TFT substrate, a CF substrate facing the TFT substrate, a sealing material sandwiched between the TFT substrate and the CF substrate and formed in a peripheral portion of the substrates, and a liquid crystal layer interposed between the TFT substrate and the CF substrate, wherein the CF substrate has a light shielding layer in the peripheral portion where the sealing material is provided and the light shielding layer has a gap in a region where the light shielding layer overlaps with a wiring of the TFT substrate (see Patent Literature 9).

Another disclosed liquid crystal display panel is a liquid crystal display panel including an active matrix substrate and a counter substrate facing each other, and a liquid crystal layer provided between the substrates to define a display region and a non-display region around the display region, wherein the non-display region includes a flame-like seal portion between the substrates, the seal portion has a narrow linear portion and a wide portion that is wider than the linear portion and is formed by a photocurable material; the active matrix substrate has a light-shielding display wiring patterned therein; and the counter substrate has a black matrix formed along the inner periphery of the seal portion and having a cutout at a position corresponding to the wide portion (see Patent Literature 10).

CITATION LIST

Patent Literature

[Patent Literature 1] JP-A 2006-39524
[Patent Literature 2] JP-A 2006-79041
[Patent Literature 3] JP-A 2008-26865
[Patent Literature 4] JP-T 2005-522734
[Patent Literature 5] WO 2011/067963
[Patent Literature 6] WO 2009/150862
[Patent Literature 7] WO 2010/137197
[Patent Literature 8] WO 2011/135873
[Patent Literature 9] WO 2006/098475
[Patent Literature 10] JP-A 2007-65037

SUMMARY OF INVENTION

Technical Problem

In production of a display device (e.g., liquid crystal display), a step of inspecting a seal enclosing a space between substrates facing each other may be carried out. More specifically, whether or not a seal is formed at an appropriate position, whether or not the width of the seal is enough, whether or not the seal is without breaks, whether or not the sealing material is sufficiently cured, and the like are checked with observation equipment (e.g., loupe, microscope). Moreover, even after delivery of the products, when defective display occurs, the seal may be inspected to investigate the cause of the defect. If the width of the seal is narrow, the adhesion strength may be insufficient, failing to ensure the reliability. If the seal protrudes into the display region, defective display may occur at an end portion of the display region. If the sealing material is not sufficiently cured, in the case of a liquid crystal display, the sealing material may ooze out to the liquid crystal layer, causing defective display at an end portion of the display region.

However, in a display device having a shift register monolithically formed on an array substrate, if a flame region is narrow, the seal may not be easily inspected. The reason is described in the following. A shift register includes various elements such as TFTs. Among the elements, the size of an output transistor connected to a bus line is large. In addition, the shift register commonly includes a bootstrap capacitor connected to the output transistor, and the size of the bootstrap capacitor is also large. Especially, in a case where amorphous silicon is used or a case where the definition is high or the panel size is large, the output transistor and bootstrap capacitor become large in size. Moreover, the TFTs and capacitors commonly include a light-shielding electrode to function as a light-shielding member. In a liquid crystal display, a counter substrate facing an array substrate commonly has a black matrix (BM). In a case where a flame region is narrow, the BM may be formed to face especially a region where a shift register is arranged in the flame region. As above, in a case where the flame region is narrow, the seal may be provided close to the display region and arranged between the light-shielding member (e.g., BM) and the output transistor and the bootstrap capacitor. As a result, the state of the seal may not be easily observed from either the array substrate side or the counter substrate side.

The present invention is devised in consideration of the state of the art, and aims to provide a display device in which a seal is easily inspected.

Solution to problem

The present inventors have intensively studied about a display device in which a seal is easily inspected to focus on the structure of a bootstrap capacitor. The present inventors arrived at providing a bootstrap capacitor with a translucent portion, more specifically, forming a first cutout and/or a first opening in a first electrode and a second cutout and/or a second opening facing the first cutout and/or the first opening in a second electrode in a bootstrap capacitor. This enables to observe the state of a seal through a translucent portion from the array substrate side even if a light-shielding member (e.g., BM) is provided on a counter substrate, thereby solving the above problem. Thus, the present invention was completed.

The present invention provides a display device (hereafter, also referred to as a "display device according to the present invention") including: a first substrate; a second substrate facing the first substrate; and a seal provided between the first substrate and the second substrate, wherein the first substrate includes an insulating substrate, a shift register monolithically formed on the insulating substrate, and a plurality of bus lines, the shift register includes a plurality of cascade-connected unit circuits, the plurality of unit circuits each include a clock terminal receiving a clock signal, an output terminal connected to a corresponding bus line and outputting an output signal, a transistor (output transistor) having one of a source and a drain connected to the clock terminal and the other of the source and the drain connected to the output terminal, and a capacitor (bootstrap capacitor) having a first terminal connected to a gate of the transistor and a second terminal connected to the output terminal, the capacitor includes a first electrode, an insulating layer on the first electrode, and a second electrode on the insulating layer, and at least one of the plurality of unit circuits has the first electrode provided with at least one of a first cutout and a first opening, and the second electrode provided with at least one of a second cutout and a second opening facing the at least one of the first cutout and the first opening.

The configuration of the display device of the present invention is not especially limited as long as it essentially includes such components. The display device may or may not include other components.

The following will describe preferable embodiments of the display device according to the present invention. The following preferable embodiments may be employed in combination. An embodiment including two or more of the following preferable embodiments are also a preferable embodiment.

The counter substrate may include a light-shielding member facing the shift register. Alternatively, the counter substrate may not include a light-shielding member facing the shift register. In the former case, an effect of enabling easy inspection of a seal is remarkably exerted. In the latter case too, a seal is more easily observed compared to a case where a translucent portion is not provided in a bootstrap capacitor, so that the effect is exerted.

The seal may contain a cured substance of a photocurable material. This enables to irradiate a photocurable sealing material with light through a translucent portion in the production process, suppressing formation of an uncured portion of the sealing material. As a result, the substrates can be more firmly bonded to each other. In the case of a liquid crystal display, reduction in the display quality due to components in the uncured portion of the sealing material is suppressed.

The material may further have heat-curability. Even in a case where performing photoirradiation only may lead to formation of an uncured portion in the sealing material, the use of a photocurable and heat-curable sealing material enables to more surely cure the sealing material by heat treatment. Accordingly, the substrates can be very firmly adhered to each other. In the case of a liquid crystal display, reduction in the display quality due to components of the uncured portion of the sealing material can be effectively suppressed.

The transistor may be arranged in a region between the capacitor and a display region of the first substrate. The seal may not be arranged over the transistor. Thus, the seal can be easily arranged so as not to overlap with the output transistor. This enables to more surely perform an inspection of the seal. In a case where a photocurable sealing material is used, formation of an uncured portion in the sealing material is more surely prevented.

The capacitor may be arranged in a region between the transistor and the display region of the first substrate. The transistor is covered with the seal. At least part of the capacitor may be arranged under the seal. With this configuration, even in a case where a photocurable sealing material is used and an uncured portion is formed in the sealing material over the output transistor, a portion adjacent to the uncured portion on the display region side can be sufficiently cured. Accordingly, a harmful effect in the display region due to the uncured portion can be suppressed. In addition, compared to a case where the output transistor is arranged in a region between the bootstrap capacitor and the display region, the seal is closer to the display region, so that the flame region can be made narrower.

The capacitor may further include a second insulating layer on the second electrode and a transparent electrode on the second insulating layer, and the transparent electrode may be connected to the first electrode. This increases the capacitance of the bootstrap capacitor, so that the flame region can be further narrowed.

The kind of the bus line is not particularly limited, and the following embodiments (A) to (C) are preferable. It is to be noted that the plurality of bus lines are normally connected to a row of or a column of pixel circuits in common.

In Embodiment (A), the first substrate includes a plurality of pixel circuits in a display region, the plurality of pixel circuits each include a pixel transistor and a pixel electrode connected to the pixel transistor, and the plurality of bus lines are respectively connected to corresponding gates of a plurality of the pixel transistors. Such an embodiment is suitable in a case where the display device according to the present invention is used for a liquid crystal display.

In Embodiment (B), the first substrate includes a plurality of pixel circuits provided in a display region, the plurality of pixel circuits each include a pixel transistor and an electroluminescence element connected to the pixel transistor, and the plurality of bus lines are respectively connected to corresponding gates of a plurality of the pixel transistors. Such an embodiment is suitable in a case where the display device according to the present invention is used for an organic EL display.

In Embodiment (C), the plurality of bus lines are a first plurality of bus lines, the first substrate includes a plurality of pixel circuits provided in a display region and a plurality of data bus lines, the plurality of pixel circuits each include a first pixel transistor, a second pixel transistor connected to a corresponding data bus line, and an electroluminescence element connected to the first pixel transistor, and the first plurality of bus lines are respectively connected to corresponding gates of a plurality of the second pixel transistors. Such an embodiment is suitable in a case where the display device according to the present invention is used for an organic EL display.

The transistor may contain an oxide semiconductor.

The oxide semiconductor may contain indium (In), gallium (Ga), zinc (Zn), and oxygen (O).

Advantageous Effects of Invention

The present invention provides a display device in which the seal is easily inspected.

BRIEF DESCRIPTION OF DRAWINGS

FIG. 27 is a schematic plan view illustrating a structure in a flame region of a liquid crystal display of Embodiment 7.

DESCRIPTION OF EMBODIMENTS

The present invention will be more specifically described with reference to drawings based on, but not limited to, embodiments.

(Embodiment 1)

Figure 1:
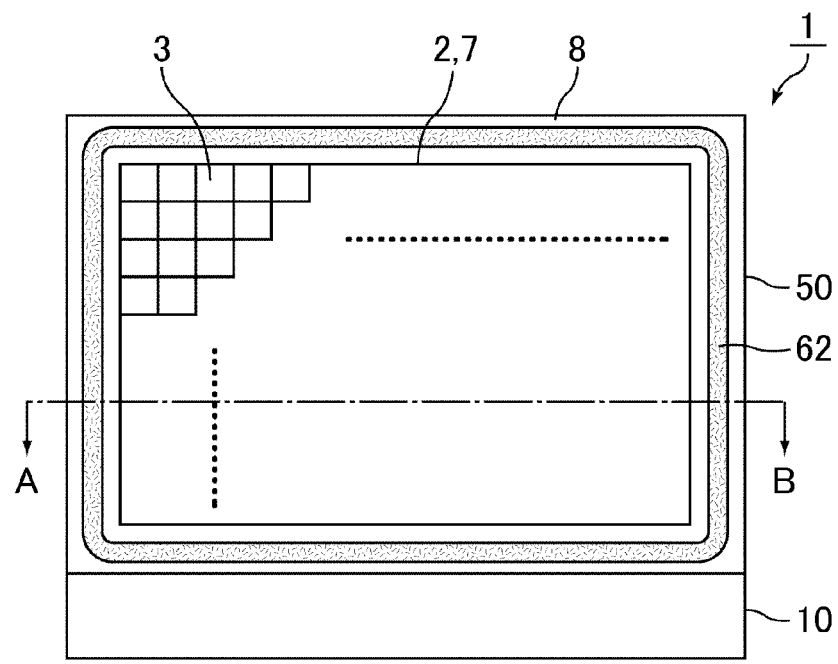
FIG. 1 is a schematic plan view of a liquid crystal panel included in a liquid crystal display of Embodiment 1.
Figure 2:
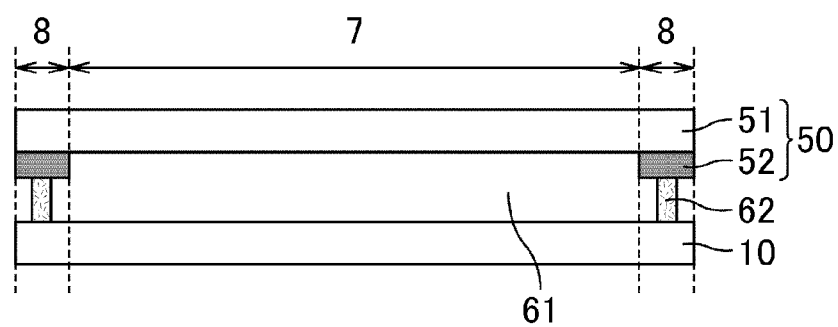
FIG. 2 is a schematic cross-sectional view taken along the A-B line in FIG. 1.
Figure 3:
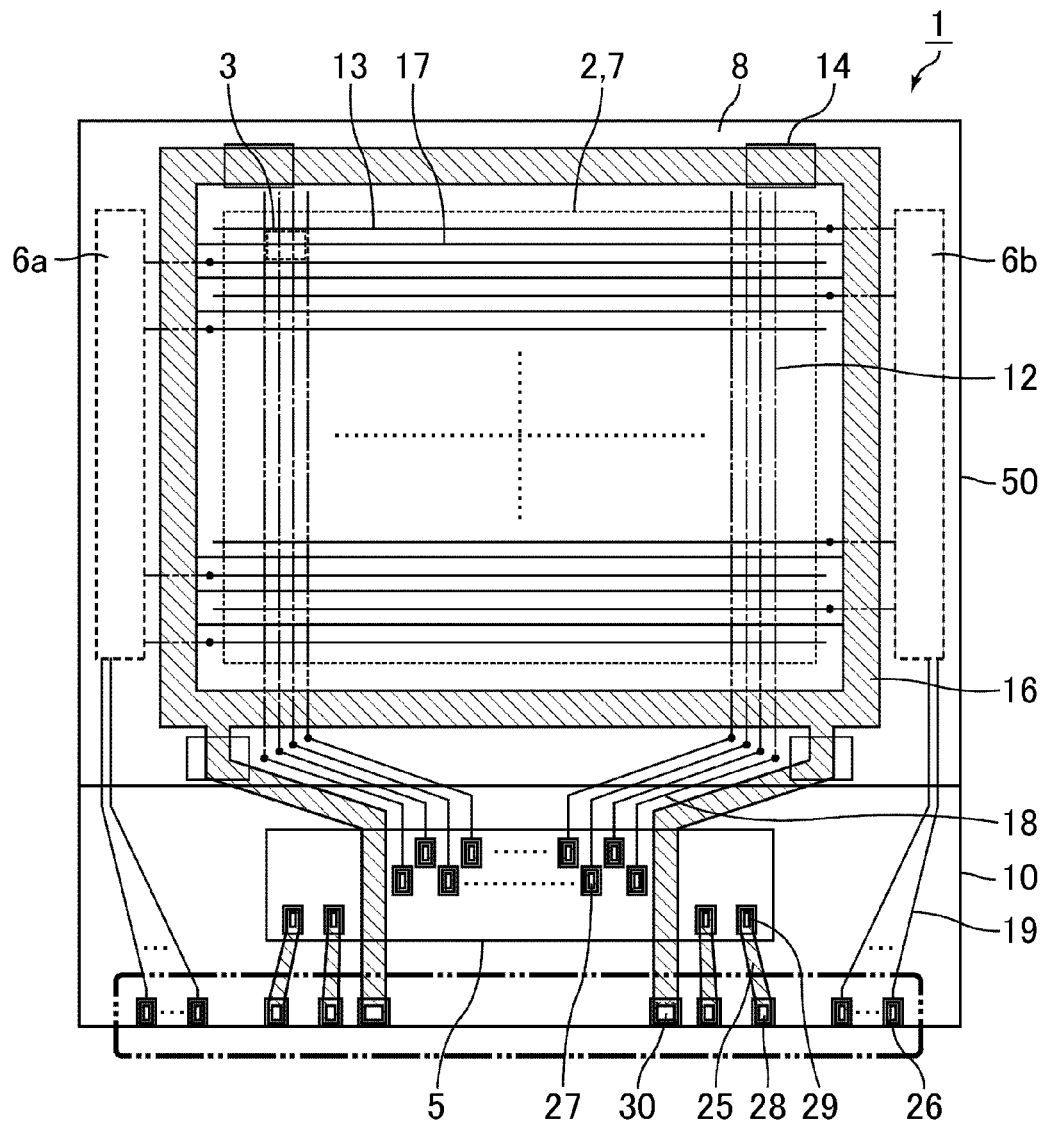
FIG. 3 is a schematic plan view of a liquid crystal panel included in the liquid crystal display of Embodiment 1.

With reference to FIGS. 1 to 13, a description is given on a liquid crystal display of Embodiment 1. First, with reference to FIGS. 1 to 3, the entire structure of a liquid crystal display of the present embodiment is described. FIG. 1 is a schematic plan view of a liquid crystal panel included in a liquid crystal display of Embodiment 1. FIG. 2 is a schematic cross-sectional view taken along the A-B line in FIG. 1. FIG. 3 is a schematic plan view of a liquid crystal panel included in the liquid crystal display of Embodiment 1.

The liquid crystal display of the present embodiment is an active matrix drive type transmission liquid crystal display, and includes a liquid crystal panel 1, a back light unit (not illustrated) arranged on a rear side of the liquid crystal panel 1, a control section (not illustrated) that drives and controls the liquid crystal panel 1 and the back light unit, and a flexible substrate (not illustrated) connecting the liquid crystal panel 1 to the control section.

The liquid crystal panel 1 includes a display portion 2 for displaying images. In the display portion 2, a plurality of pixels 3 is arranged in a matrix. Each pixel 3 may include a plurality of colors (e.g., three colors including red, green, and blue) of sub pixels. FIG. 3 shows such a case. The liquid crystal display of the present embodiment may be a monochrome liquid crystal display. In such a case, each pixel 3 does not need to be divided into plural sub pixels.

The liquid crystal panel 1 has an array substrate (active matrix substrate) corresponding to the first substrate, a counter substrate 50 corresponding to the second substrate and facing the array substrate 10, a liquid crystal layer (display medium) 61 and a seal 62 provided between the substrates 10 and 50, an alignment film (not illustrated) provided on a surface on a liquid crystal layer 61 side of the array substrate 10, an alignment film (not illustrated) provided on a surface on a liquid crystal layer 61 side of the counter substrate 50, and a source driver 5 mounted on the array substrate 10. The liquid crystal panel 1, the array substrate 10, and the counter substrate 50 each include a region (display region) 7 corresponding to the display portion 2, and a region (flame region) around the display region 7. The source driver is a driving circuit for a later-described source bus line.

The seal 62 is formed in the flame region 8 in such a manner as to surround the display region 7. The seal 62 bonds the substrates 10 and 50 to each other and encloses the liquid crystal layer 61 between the substrates 10 and 50.

The array substrate 10 is provided on the rear side of the liquid crystal display, and the counter substrate 50 is provided on a viewer's side. On the surface opposite to the liquid crystal layer 61 of each of the substrates 10 and 50, a polarizer (not illustrated) is attached. These polarizers are commonly arranged in a Crossed Nicole. The source driver 5 is mounted in a region not facing the counter substrate 50 of the array substrate 10, namely in a region (hereafter, also referred to as a protruding region) protruding from the counter substrate, by COG (Chip On Glass) technique.

The array substrate 10 has gate drivers 6a and 6b which are monolithically formed on right and left sides of the display region 7, terminals 26, 27, 28, 29, and 30 each formed in the protruding region, and source bus lines (data signal lines) 12 provided to vertically cross the display region 7, gate bus lines (scan signal lines) 13 and common bus lines 17 which horizontally cross the display region 7, lead wires 18 and 19 each formed in the flame region 8, a wiring (hereafter, also referred to as a common trunk wiring) 16 formed in the flame region so as to surround the display region 7, and an input wiring 25 formed in the flame region. The gate bus lines 13 include gate bus lines 13 connected to output terminals of the gate driver 6a on the left side and gate bus lines 13 connected to output terminals of the gate driver 6b on the right side. These two kinds of gate bus lines 13 are alternately arranged. The gate bus lines 13 correspond to the bus lines in Embodiment (A). The flexible substrate is mounted in a region (region surrounded by thick two-dot chain line in FIG. 3) where the terminals 26, 28, and 30 are provided. Each source bus line 12 is connected to an output portion of the source driver through the corresponding lead wire 18 and the corresponding terminal 27. To an input portion of the source driver 5, various signals and a source voltage are applied through the flexible substrate, the terminal 28, the input wiring 25, and the terminal 29. To the common trunk wiring 16, a common signal is sent from the control section through the flexible substrate and the terminal 30. The common signal refers to a signal applied to all the pixels in common. The common bus line 17 is connected to the common trunk wiring 16 in the flame region 8. To the common bus line 17, a common signal is applied from the common trunk wiring 16.

To the gate drivers 6a and 6b, various signals and a source voltage are applied from the control section through the flexible substrate, the terminal 26, and the lead wire 19. The detail is described later. Gate drivers called "gate monolithic", "gate driverless", "panel built-in gate driver", "gate in panel", "gate on array" and the like may be included in the scope of the gate drivers 6a and 6b. Instead of providing two gate drivers 6a and 6b, only one gate driver that similarly functions as two gate drivers 6a and 6b may be provided.

The counter substrate 50 has a transparent insulating substrate 51 (e.g., glass substrate), a black matrix (BM) 52 functioning as a light-shielding member, and a plurality of pillar-shaped spacers (not illustrated). The BM 52 is formed to block light in the flame region 8 and a region facing the bus lines. In FIG. 2, illustration of the BM 52 is omitted in the display region 7. In a case where each pixel 3 includes plural colors of sub pixels, the counter substrate 50 may have plural colors of color filters (not illustrated). Each color filter is provided in the display region 7 and formed to cover a region defined by the BM 52, that is, an opening of the BM 52. The counter substrate 50 may have an overcoat film. The overcoat film may cover all the color filters. The pillar-shaped spacers are arranged in a light-shielding region on the BM 52.

Any liquid crystal mode may be employed for the liquid crystal display of the present embodiment. In a case where the liquid crystal mode employed is a mode using a vertical electric field such as TN (Twisted Nematic) mode and VA (Vertical Alignment) mode, the counter substrate 50 has a counter electrode to which a common signal is applied and the array substrate 10 has a common transition electrode 14 connected to the common trunk wiring 16. The both electrodes are connected to each other through a conductive member. Examples of the conductive member include a carbon paste and a resin blended in the seal 62 and coated with a metal such as gold.

Figure 4:
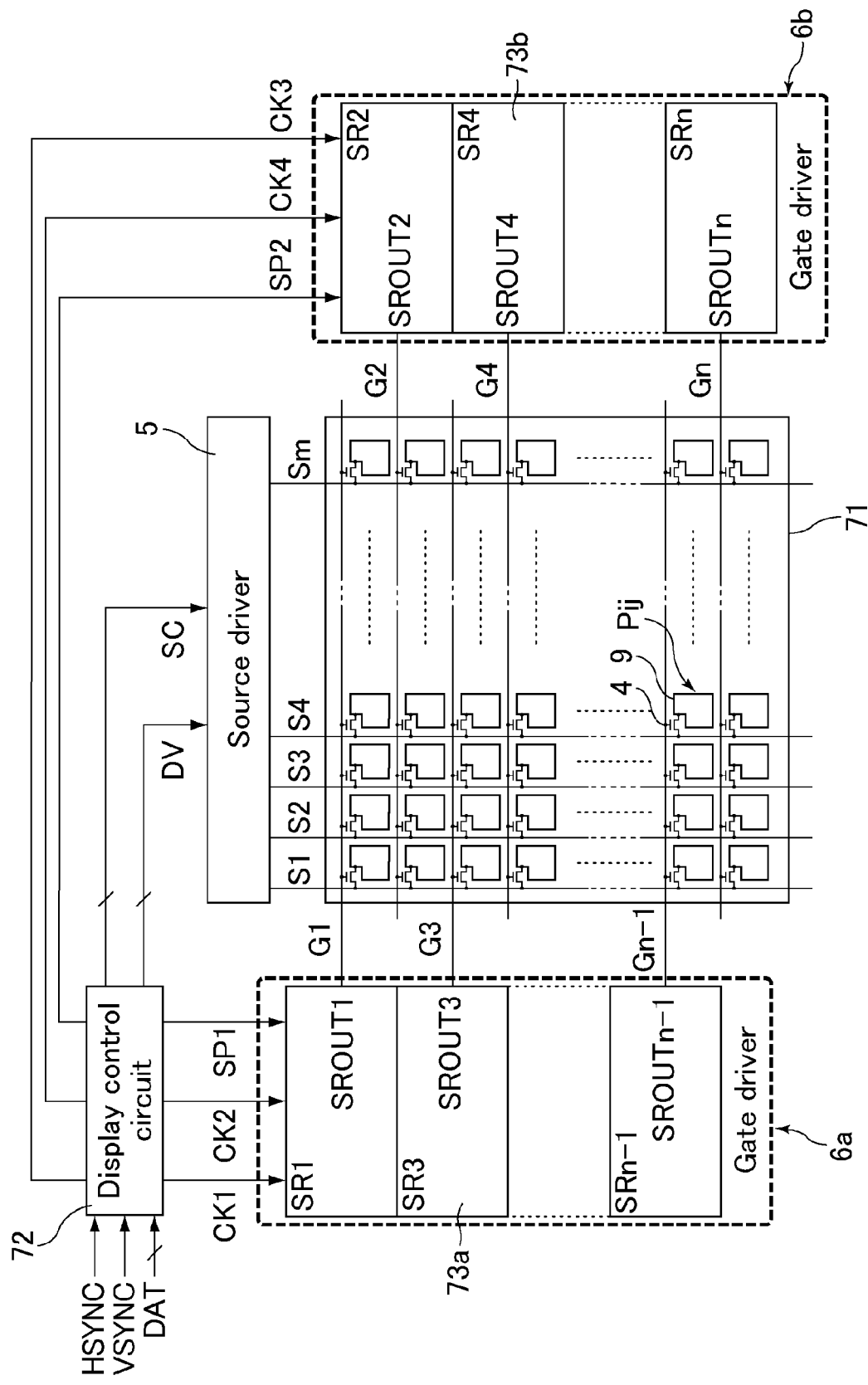
FIG. 4 is a block diagram illustrating a structure of the liquid crystal display of Embodiment 1.
Figure 5:
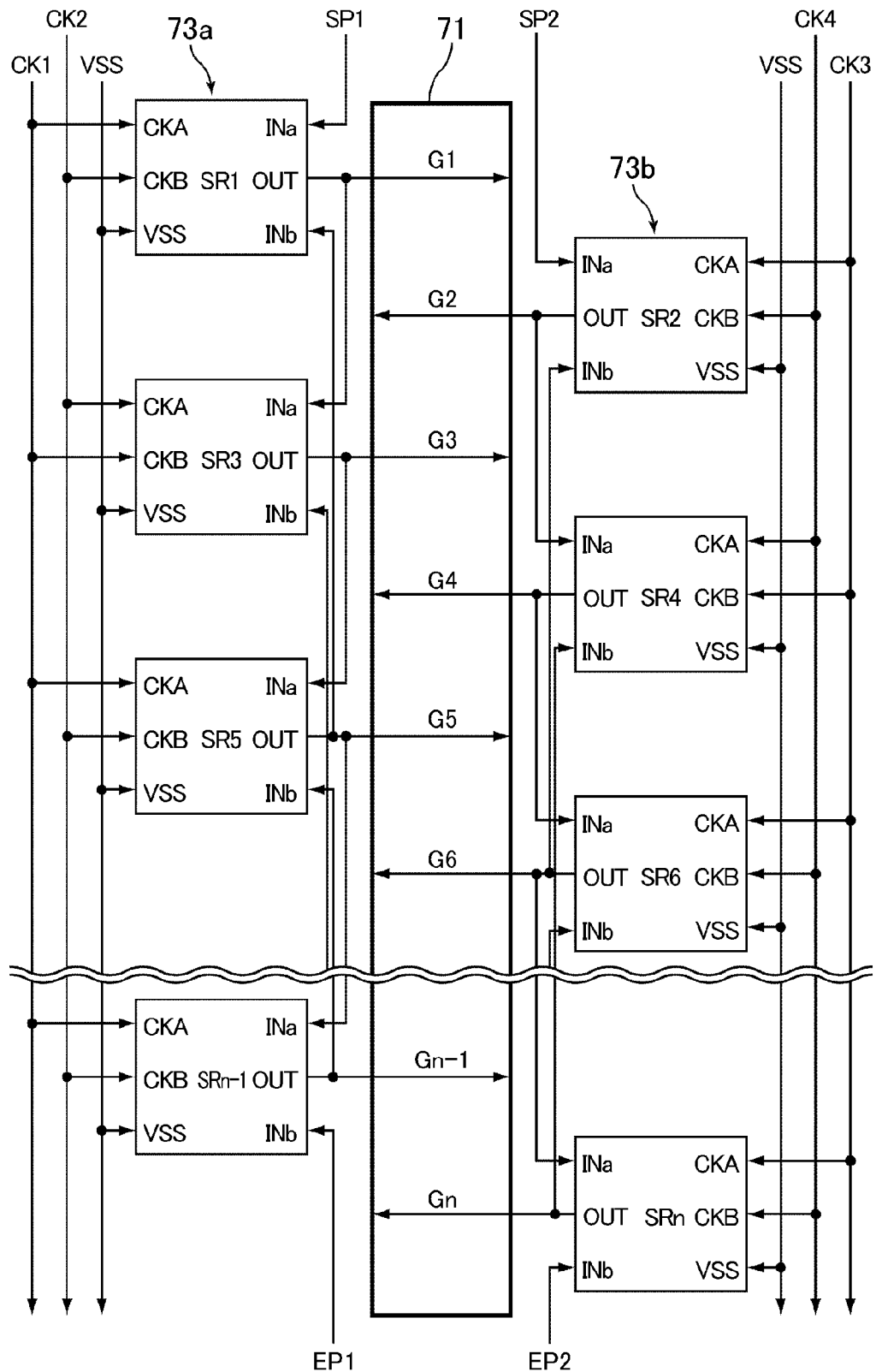
FIG. 5 is a block diagram illustrating a structure of a shift register in Embodiment 1.
Figure 6:
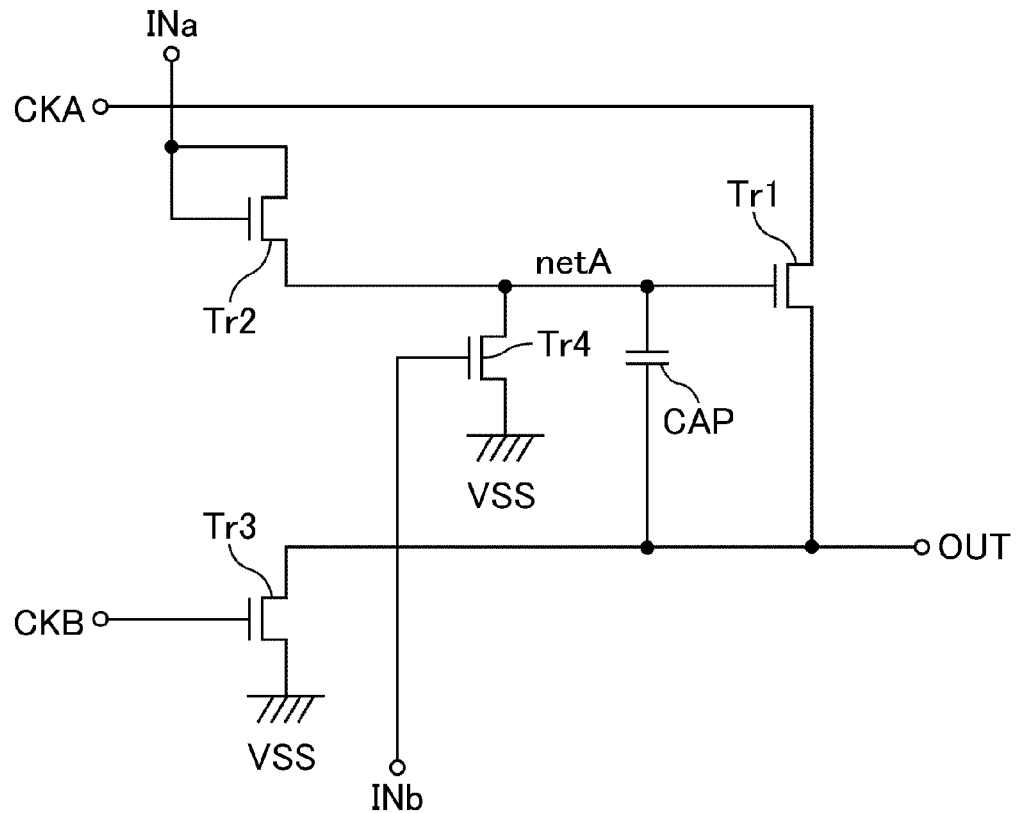
FIG. 6 is a circuit diagram of a unit circuit included in the shift register in Embodiment 1.
Figure 7:
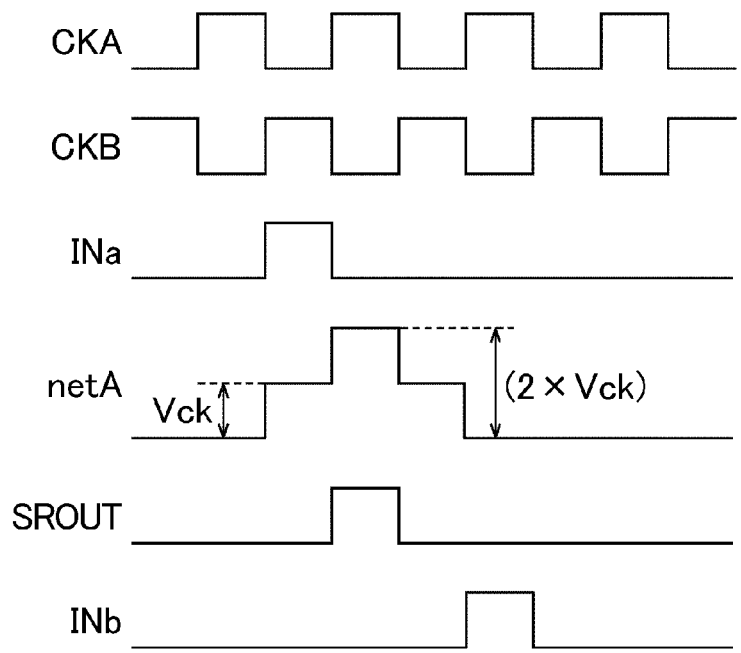
FIG. 7 is a timing chart of the shift register in Embodiment 1.
Figure 8:
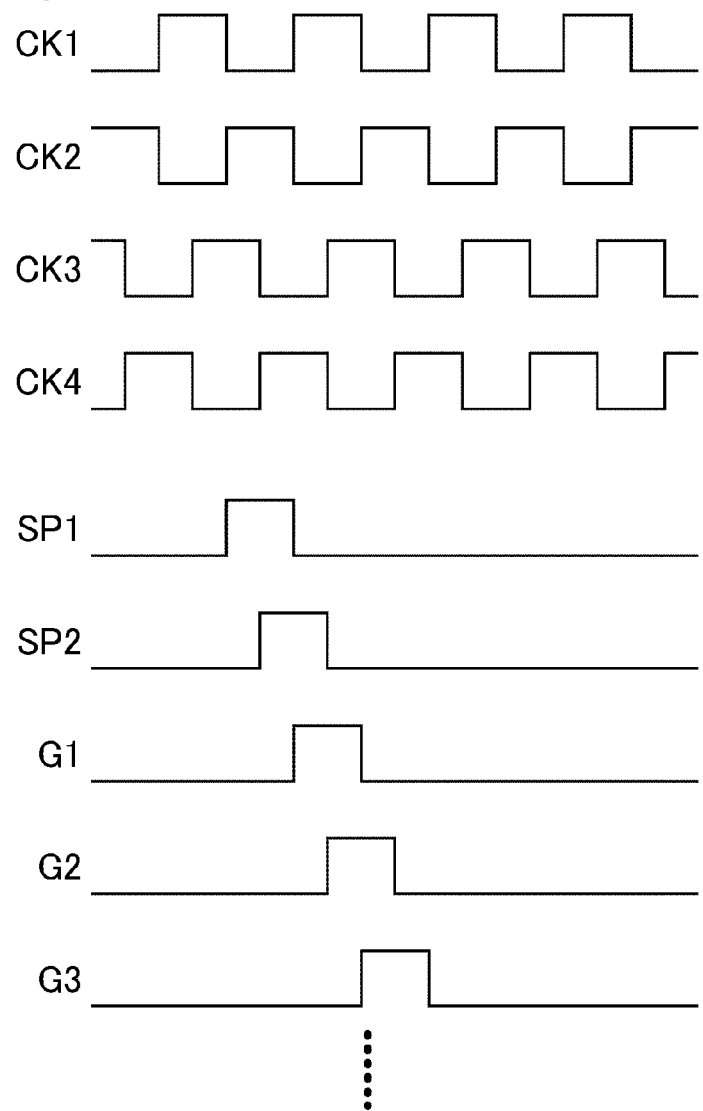
FIG. 8 is a timing chart of the shift register in Embodiment 1.

Next, the circuit structure and operation of the liquid crystal display of the present embodiment are described with reference to FIGS. 4 to 8. FIG. 4 is a block diagram illustrating a structure of the liquid crystal display of Embodiment 1. FIG. 5 is a block diagram illustrating a structure of a shift register in Embodiment 1. FIG. 6 is a circuit diagram of a unit circuit included in the shift register in Embodiment 1. FIGS. 7 and 8 each show a timing chart of the shift register in Embodiment 1.

As illustrated in FIG. 4, the liquid crystal display of the present embodiment has a pixel array 71, a display control circuit 72 provided in the control section, a source driver 5, and gate drivers 6a and 6b.

The pixel array 71 includes n lines of gate bus lines G1 to Gn corresponding to the gate bus lines 13, m lines of source bus lines S1 to Sm corresponding to the source bus lines 12, and (m×n) pieces of pixel circuits Pij each formed in the pixel 3. Here, n and m each represent an integer of at least 2, i represents an integer of not less than 1 but not more than n, and j represents an integer of not less than 1 but not more than m. The gate bus lines G1 to Gn are arranged in parallel with one another. The source bus lines S1 to Sm are arranged in parallel with one another and orthogonally to the gate bus lines G1 to Gn. In the vicinity of the intersection between the gate bus line Gi and the source bus line Sj, the pixel circuit Pij is arranged. Accordingly, (m×n) pieces of the pixel circuits Pij are arranged two-dimensionally in such a manner that m pieces of the circuits are arranged in the row direction and n pieces of the circuits are arranged in the column direction. The gate bus line Gi is connected to the pixel circuits Pij arranged in the i row in common. The source bus line Sj is connected to the pixel circuits Pij arranged in the j column in common. Each pixel circuit Pij has a pixel TFT 4 as a switching element and a pixel electrode 9. The gate of the TFT 4 is connected to the gate bus line Gi. One of the drain and the source of the TFT 4 is connected to the source bus line Sj and the other is connected to the pixel electrode 9.

To the liquid crystal display of the present embodiment, control signals (e.g., a horizontal synchronization signal HSYNC, a vertical synchronization signal VSYNC) and an image signal DAT are supplied from the outside. The display control circuit 72 outputs clock signals CK1 and CK2 and a start pulse SP1 to the gate driver 6a, clock signals CK3 and CK4 and a start pulse SP2 to the gate driver 6b, and a control signal SC and a digital image signal DV to the source driver 5 based on the signals.

The gate driver 6a includes a shift register 73a, and the shift register 73a includes a plurality of cascade-connected unit circuits SR1, SR3 ... SRn−1. The unit circuits SR1, SR3 ... SRn−1 are respectively connected to odd-numbered gate bus lines G1, G3 ... Gn−1.

The gate driver 6b includes a shift register 73b, and the shift register 73b includes a plurality of cascade-connected unit circuits SR2, SR4 ... SRn. The unit circuits SR2, SR4 ... SRn are respectively connected to odd-numbered gate bus lines G2, G4 ... Gn.

The shift registers 73a and 73b control the level of the output signals SROUT1 to SROUTn to a high level (indicating a selected state) one by one. The output signals SROUT1 to SROUTn are respectively applied to the gate bus lines G1 to Gn. The gate bus lines G1 to Gn are thereby selected one by one, so that pixel circuits Pij in the same row are selected in a lump sum. In other words, the pixel TFTs 4 of the pixel circuits Pij arranged in a row are turned ON.

The source driver 5 impresses a voltage corresponding to the digital image signal DV to the source bus lines S1 to Sm based on the control signal SC and the digital image signal SV. This enables to write (impress) a voltage corresponding to the digital image signal DV to the selected pixel circuits PiJ in a row. In this manner, the liquid crystal display of the present invention displays images.

As illustrated in FIG. 5, each of the unit circuits SR1 to SRn has input terminals INa and INb, clock terminals CKA and CKB, a power supply terminal VSS, and an output terminal OUT.

To the shift register 73a, a start pulse SP1, an end pulse EP1, two-phase clock signals CK1 and CK2, and a low level potential VSS (the same sign as the power supply terminal is assigned for convenience) are applied. The start pulse SP1 is supplied to the input terminal INa of the unit circuit SR1 on the first stage in the shift register 73a. The end pulse EP1 is supplied to the input terminal INb of the unit circuit SRn−1 on the final stage in the shift register 73a. The clock signal CK1 is supplied to the clock terminals CKA of the unit circuits on the odd-numbered stages in the shift register 73a and to the clock terminals CKB of the unit circuits on the even-numbered stages in the shift register 73a. The clock signal CK2 is supplied to the clock terminals CKA of the unit circuits on the even-numbered stages in the shift register 73a and to the clock terminals CKB of the unit circuits 10 on the odd-numbered stages in the shift register 73a. The low level potential VSS is supplied to the power source terminals VSS of all the unit circuits in the shift register 73a. The output signals SROUT1, SROUT3, ... SROUTn−1 are respectively outputted from the output terminals OUT of the unit circuit SR1, SR3, ... SRn−1. The output signals SROUT1, SROUT3, ... SROUTn−1 are respectively supplied to the gate bus lines G1, G3, ... Gn−1. Each output signal is sent to the input terminal INa of the unit circuit on the stage after the next stage (next stage if considered within the shift register 73a) and to the input terminals INb of the unit circuits on the stage preceding by four stages (stage before the last stage if considered within the shift register 73a).

To the shift register 73b, a start pulse SP2, an end pulse EP2, two-phase clock signals CK3 and CK4, and a low level potential VSS are supplied. The start pulse SP2 is supplied to the input terminals INa of the unit circuits SR2 on the first stage in the shift register 73b. The end pulse EP2 is supplied to the input terminals INb of the unit circuits SRn on the final stage in the shift register 73b. The clock signal CK3 is supplied to the clock terminals CKA of the unit circuits on the odd-numbered stages in the shift register 73b and to the clock terminals CKB of the unit circuits on the even-numbered stages in the shift register 73b. The clock signal CK4 is supplied to the clock terminals CKA of the unit circuits on the even-numbered stages in the shift register 73b and to the clock terminals CKB of the unit circuits 10 on the odd-numbered stages in the shift register 73b. The low level potential VSS is supplied to the power source terminals VSS of all the unit circuits in the shift register 73b. Output signals SROUT2, SROUT4 . . . SROUTn are respectively outputted from the output terminals OUT of the unit circuits SR2, SR4 . . . SRn. The output signals SROUT2, SROUT4 . . . SROUTn are respectively supplied to the gate bus lines G2, G4 . . . Gn. Each output signal is sent to the input terminals INa of the unit circuits on the stage after the next (next stage if considered within the shift register 73b) and to the input terminals INb of the unit circuits on the stage preceding by four stages (stage before the last stage if considered within the shift register 73b).

The low level potential VSS is preferably a negative potential from the standpoint of surely turning OFF an n-channel TFT. In a case where a p-channel TFT is used as the pixel TFTs 4, the potential may be a positive potential.

As illustrated in FIG. 6, each unit circuit includes transistors Tr1 to Tr4 which are n-channel TFTs, and a capacitor (hereafter also referred to as a bootstrap capacitor) CAP. Hereafter, the transistor Tr1 is also referred to as an output transistor Tr1.

The output transistor Tr1 has a drain connected to the clock terminal CKA and a source connected to the output terminal OUT. The transistor Tr2 has a drain and a gate each connected to the input terminal INa and a source connected to the gate of the output transistor Tr1. The bootstrap capacitor CAP is provided between the gate and the source of the output transistor Tr1, and has a first terminal connected to the gate of the output transistor Tr1 and a second terminal connected to the output terminal OUT. The transistor Tr3 has a drain connected to the output terminal OUT, a gate connected to the clock terminal CKB, and a source connected to the power supply terminal VSS. The transistor Tr4 has a drain connected to the gate of the output transistor Tr1, a gate connected to the input terminal INb, and a source connected to the power supply terminal VSS.

The output transistor Tr1 is provided between the clock terminal CKA and the output terminal OUT and functions as a transistor (transmission gate) switching whether or not to transmit the clock signal in accordance with the gate potential. The gate of the output transistor Tr1 is capacity-coupled with the conductive terminal (source) on the output terminal OUT side. Accordingly, as described later, when the output transistor Tr1 is ON and the clock signal CK1 or CK3 (hereafter, also referred to as a clock signal CKA) supplied to the clock terminal CKA is at a high level, the gate potential of the output transistor Tr1 is higher than the high-level potential of the clock signal CKA. Hereafter, a node to which the gate of the output transistor Tr1 is connected is referred to as netA.

FIGS. 7 and 8 each show a timing chart of the shift registers 73a and 73b. FIG. 7 illustrates input and output signals of the unit circuits on the odd-numbered stages in each shift register and a change in the voltage of the node netA.

As illustrated in FIG. 5, the clock signal CK1 or CK3 is supplied through the clock terminal CKA and the clock signal CK2 or CK4 is supplied through the clock terminal CKB to the unit circuits on the odd-numbered stages in each shift register. As illustrated in FIG. 8, the period where the potential of each of the clock signals CK1 to CK4 is at a high level is substantially the same as the ½ cycle. The clock signal CK2 is identical with a clock signal generated by delaying the clock signal CK1 by a ½ cycle. The clock signal CK3 is identical with a clock signal generated by delaying the clock signal CK1 by a ¼ cycle. The clock signal CK4 is identical with a clock signal generated by delaying the clock signal CK2 by a ¼ cycle.

The start pulses SP1 and SP2 are each at a high level during a period equal to the period where the potentials of the clock signals CK2 and CK4 are at a high level before start of shift operations. The end pulses EP1 and EP2 (not illustrated in FIGS. 7 and 8) are each at a high level during a period equal to the period where the potentials of the clock signals CK2 and CK4 are at a high level after completion of shift operations.

With reference to FIG. 7, a description is given on the operation of the unit circuits on the odd-numbered stages in each shift register.

First, when the level of a signal (start pulses SP1, SP2, or an output signal of the unit circuit on the stage before the last stage (the last stage if considered within each shift register), hereafter, also referred to as an input signal INa) supplied to the input terminal INa is changed from a low level to a high level, the level of the potential of the node netA is also changed to a high level through the diode-connected transistor Tr2, and the output transistor Tr1 is turned ON.

Next, when the level of the input signal INa is changed to a low level, the transistor Tr2 is turned OFF and the node netA is put into a floating state, but the ON state of the output transistor Tr1 is maintained.

Next, when the level of the clock signal CKA (clock signal CK1 or CK3) is changed from a low level to a high level, the bootstrap capacitor CAP is charged, and the potential of the node netA is raised by the bootstrap effect to about twice the amplitude Vck (=(high level potential VGH)−(low level potential VGL)) of the clock signal CKA. Since the gate potential of the output transistor Tr1 is sufficiently high, a resistance between the source and the drain of the output transistor Tr1 is reduced, so that the clock signal CKA can pass through the output transistor Tr1 without voltage drop.

When the clock signal CKA is at a high level, the potential of the node netA is raised to about twice the Vck and the output signal SROUT becomes at a high level.

Next, when the level of the clock signal CKA is changed to a low level, the potential of the node netA becomes at a high level. At the same time, when the level of the clock signal CK2 or CK4 (hereafter also referred to as a clock signal CKB) supplied to the clock terminal CKB is changed to a high level, the transistor Tr3 is turned ON and the low level potential VSS impressed on the output terminal OUT. As a result, the output signal SROUT becomes at a low level.

Next, when the level of a signal (the end pulses EP1 and EP2, or the output signal of the unit circuits on the fourth stage from the present stage (stage after the next stage if considered within each register) supplied to the input terminal INb, hereafter also referred to as an input signal INb) is changed from a low level to a high level, the transistor Tr4 is turned ON. When the transistor Tr4 is turned ON, the low level potential VSS is impressed on the node netA, the level of the potential of the node netA is changed to a low level, and the output transistor Tr1 is turned OFF.

Next, when the level of the input signal INb is changed to a low level, the transistor Tr4 is turned OFF. At this time, the node netA is put into a floating state but the OFF state of the output transistor Tr1 is maintained. Ideally, until the input signal INa next becomes at a high level, the OFF state of the output transistor Tr1 is maintained and the output signal SROUT is kept at a low level.

The transistor Tr3 is turned ON when the clock signal CKB is at a high level. Because of this, every time the clock signal CKB becomes at a high level, the low level potential VSS is impressed on the output terminal OUT. As described above, the transistor Tr3 has a function to repeatedly set the output terminal OUT to the low level potential VSS and stabilize the output signal SROUT.

The unit circuits on the even-numbered stages operate in the same way as the unit circuits on the odd-numbered stages.

As a result, the gate pulse is supplied sequentially to the gate bus lines G1, G2, G3 . . . , as illustrated in FIG. 8

Figure 9:
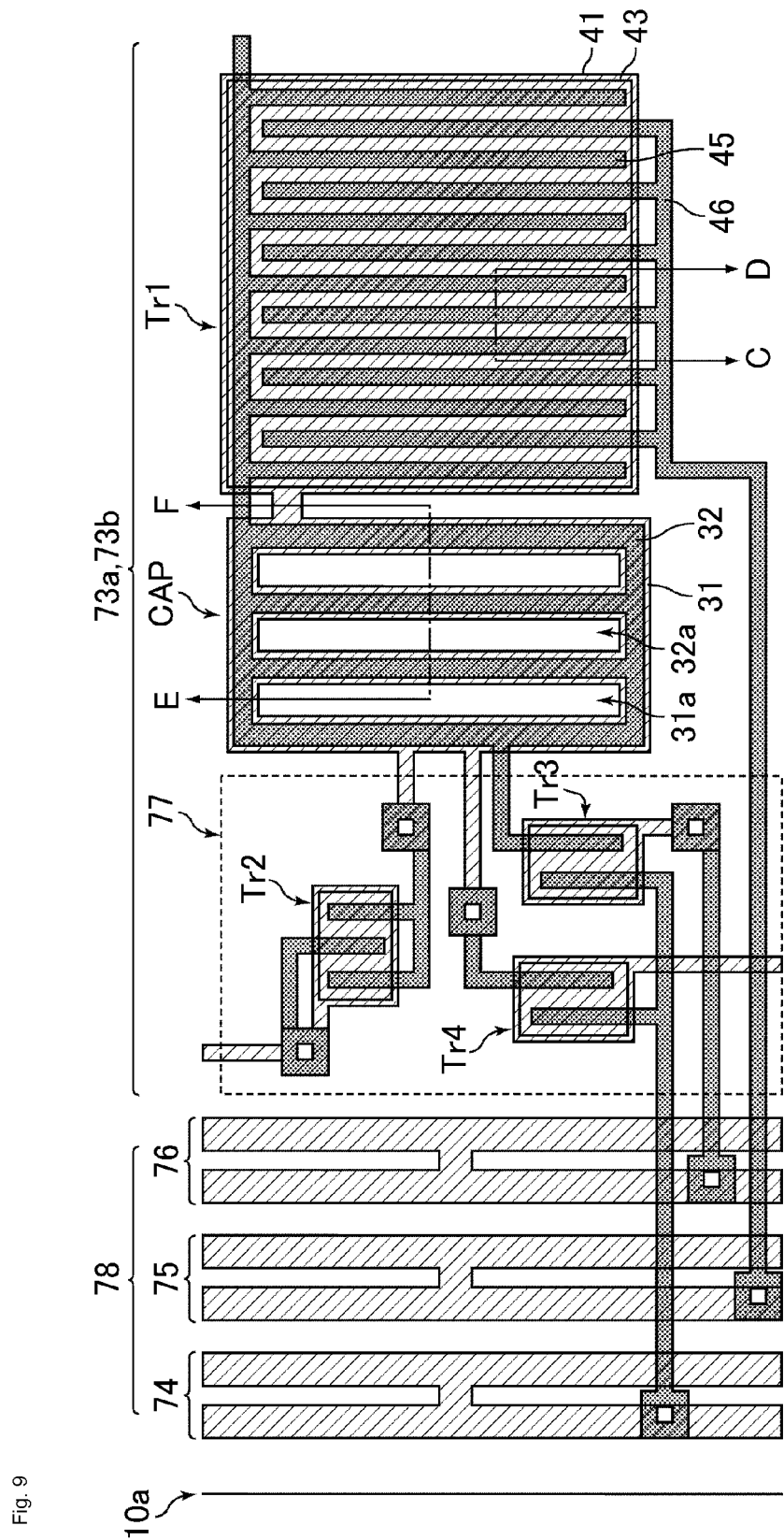
FIG. 9 is a schematic plan view illustrating a structure in a flame region of the liquid crystal display of Embodiment 1.
Figure 10:
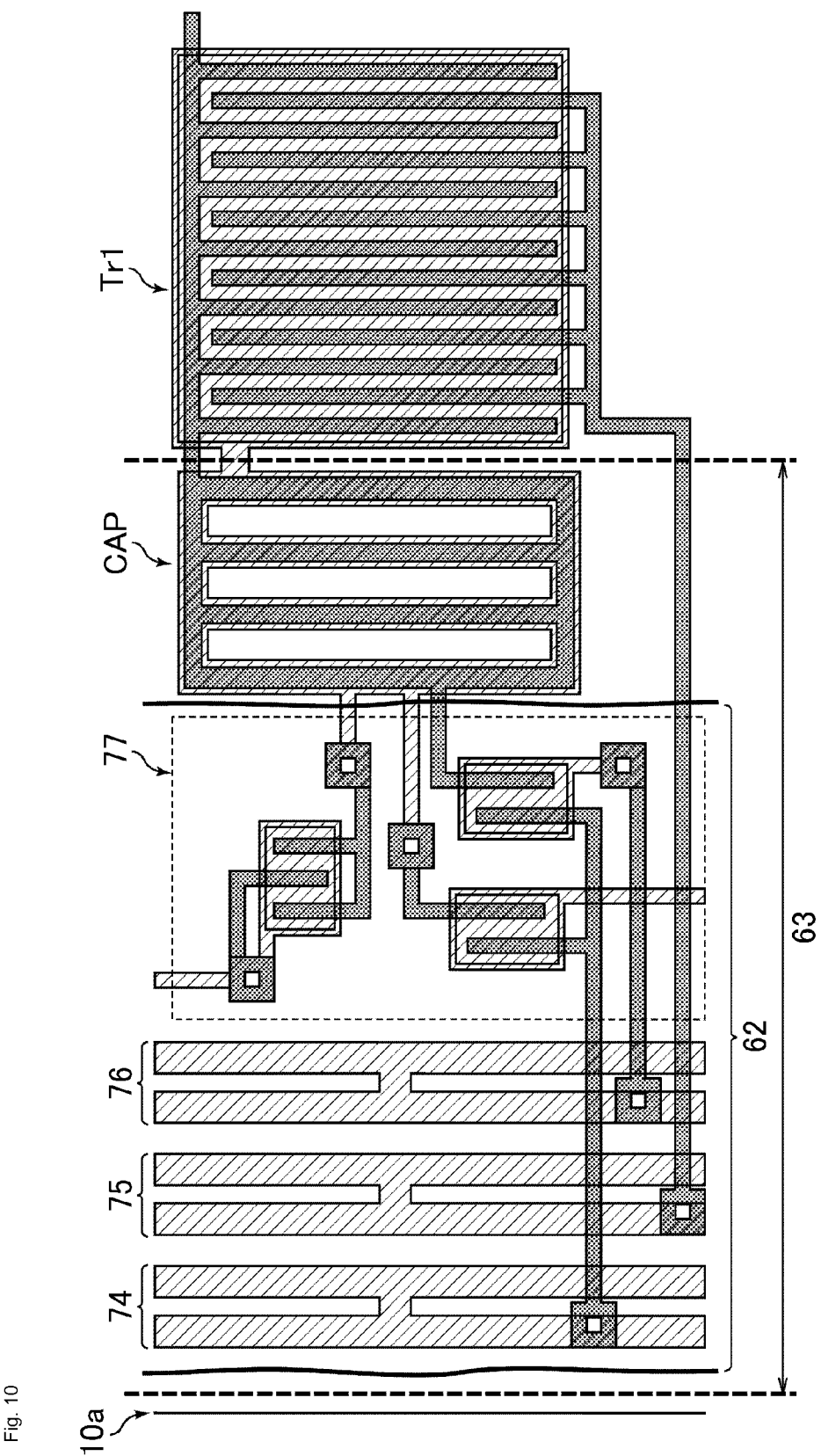
FIG. 10 is a schematic plan view illustrating a structure in the flame region of the liquid crystal display of Embodiment 1.
Figure 11:
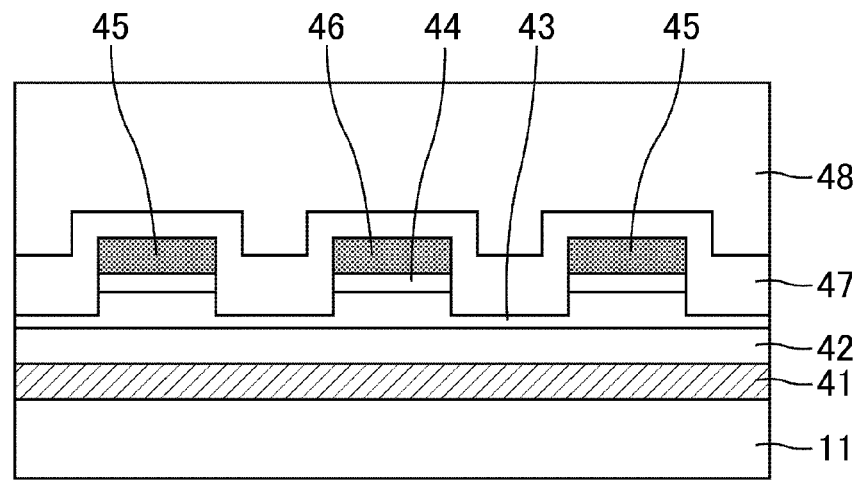
FIG. 11 is a schematic cross-sectional view taken along the C-D line in FIG. 9.
Figure 12:
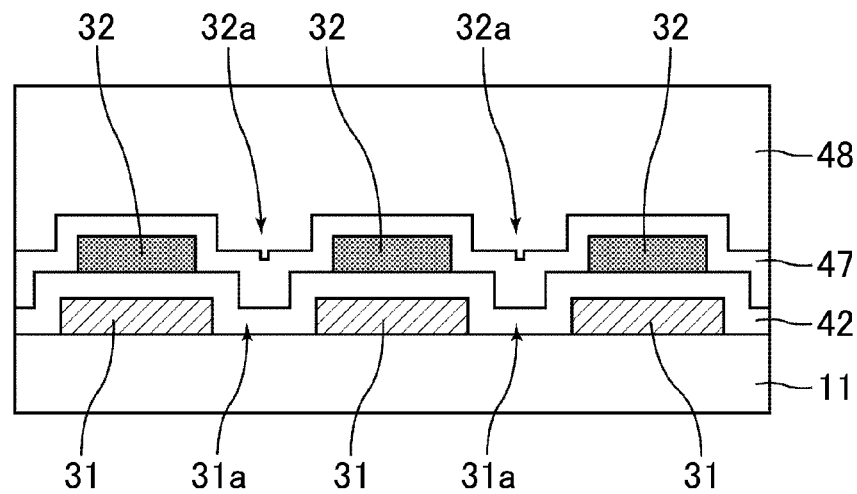
FIG. 12 is a schematic cross-sectional view taken along the E-F line in FIG. 9.
Figure 13:
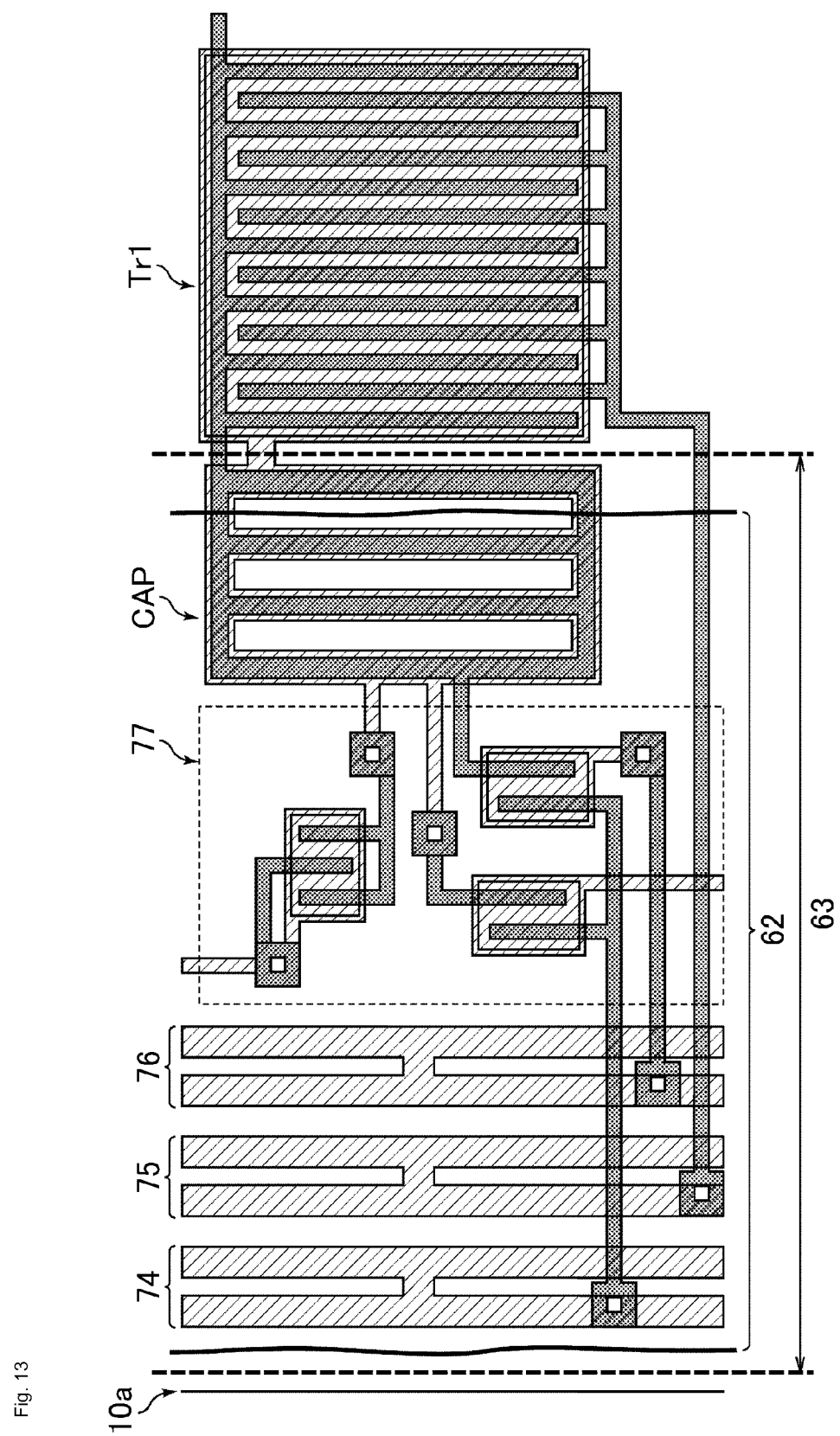
FIG. 13 is a schematic plan view illustrating a structure in the flame region of the liquid crystal display of Embodiment 1.

Next, with reference to FIGS. 9 to 13, a description is given on a structure in the flame region of the liquid crystal display of the present embodiment. FIGS. 9, 10, and 13 each show a schematic plan view illustrating a structure in the flame region of the liquid crystal display of Embodiment 1. FIG. 11 is a schematic cross-sectional view taken along the C-D line in FIG. 9. FIG. 12 is a schematic cross-sectional view taken along the E-F line in FIG. 9.

As illustrated in FIG. 9, a wiring group 78 extending in a direction orthogonal to the gate bus lines 13a is provided in each gate driver. The wiring group 78 includes a wiring 74 set at the low level potential VSS, a wiring 75 for transmitting the clock signal CK1 or CK3, and a wiring 76 for transmitting the clock signal CK2 or CK4. Each wiring has a slit-like opening formed therein.

Each of the shift registers 73a and 73b is provided in a region between the wiring group 78 and the display region. The output transistor Tr1 and the bootstrap capacitor CAP are adjacent to each other. The transistors Tr2 to Tr4 are adjacent to one another. A region (hereafter, also referred to as a control-element region) 77 where the transistors Tr2 to Tr4 are arranged is positioned between the wiring group 78 and the bootstrap capacitor CAP.

The seal 62 is formed in a belt-like region (hereafter, also referred to as a seal-coated region) 63 between thick broken lines as illustrated in FIG. 10. The seal-coated region 63 has one edge set between the wiring group 78 and the edge 10a of the array substrate 10 and the other edge set between the bootstrap capacitor CAP and the output transistor Tr1.

Each of the transistors Tr1 to Tr4 is a bottom-gate thin film transistor. Particularly, the output transistor Tr1 is large in size and has a comb-shaped source/drain structure. This structure ensures the large channel width of, for example, about several tens of micrometers to several hundreds of millimeters.

As illustrated in FIG. 11, the array substrate 10 includes a transparent insulating substrate 11 (e.g., glass substrate), and the output transistor Tr1 includes a gate electrode 41 on the insulating substrate 11, a gate insulating film 42 on the gate electrode 41, an i layer (semiconductor active layer) on the gate insulating film 42, an n+ layer 44 on the i layer 43, and a source electrode 45 and a drain electrode 46 on the n+ layer 44. The source electrode 45 and the drain electrode 46 each have teeth and the source electrode 45 and the drain electrode 46 are arranged to face each other in such a manner that the teeth thereof mesh with each other.

As illustrated in FIG. 12, the bootstrap capacitor CAP includes a first electrode 31 on the insulating substrate 11, the gate insulating film 42 provided on the first electrode 31 and shared with the output transistor Tr1, and a second electrode 32 on the gate insulating film 42. The first electrode 31 is connected to the first terminal, the gate (gate electrode 41) of the output transistor Tr1, and the node netA. The second electrode 32 is connected to the second terminal, the source (source electrode 45) of the output transistor Tr1, and the output terminal OUT.

The gate electrode 41 and the first electrode 31 are formed of the same conductive film containing a material such as molybdenum (Mo), titanium (Ti), aluminum (Al), copper (Cu), and alloys of these. The gate electrode 41 and the first electrode 31 may be formed of a multilayer film of such conductive films. The gate insulator 42 is formed of a transparent insulating film containing an inorganic insulating material (e.g., silicon nitride, silicon oxide). The gate insulator 42 may be formed of a multilayer film of such insulating films. The i layer (semiconductor active layer) 43 is formed of amorphous silicon. The n+ layer 44 is formed of amorphous silicon containing impurities (e.g., phosphor). The source electrode 45, the drain electrode 46, and the second electrode 32 are formed of the same conductive film containing a material such as Mo, Ti, Al, Cu, and alloys of these. The source electrode 45, the drain electrode 46, and the second electrode 32 may be formed of a multilayer film of such conductive films.

On the source electrode 45, the drain electrode 46, and the second electrode 32, a transparent insulating film 47 that will be serve as a passivation film is formed. The insulating film 47 is formed of an inorganic insulating film such as a silicon nitride film and a silicon oxide film. The insulating film 47 may be formed of a multilayer film of such inorganic insulating films. On the insulating film 47, a transparent insulating film 48 that will serve as a planarizing film is formed. The insulating film 48 is formed of an organic insulating film. Exemplary materials of the organic insulating film include photosensitive resins such as photosensitive acrylic resins.

The transistors Tr2 to Tr4 are each different from the output transistor Tr1 only in a planar structure and have the same cross-sectional structure as the output transistor Tr1. In each drawing, hatched components are formed of the same conductive film as the gate electrode 41 and the first electrode 31. Components with a dot pattern are formed of the same conductive film as the source electrode 45, the drain electrode 46, and the second electrode 32. Moreover, in each drawing, a white square in a region where the hatched component and the component with a dot pattern are overlapped with each other indicates a contact hole for connecting the both members to each other.

The pixel TFT 4 is a bottom-gate thin film transistor in the same way as the transistors Tr1 to Tr4, and formed together with the transistors Tr1 to Tr4 in the same process.

One distinct feature of the present embodiment is a translucent portion (light-transmitting portion) provided in the bootstrap capacitor CAP. More specifically, the first electrode 31 has at least one opening formed therein and the second electrode 32 has at least one opening corresponding to the opening in the first electrode 31. For example, as illustrated in FIG. 9, the first electrode 31 has a plurality of slit-like openings 31a formed in parallel with one another, and the second electrode 32 has a plurality of slit-like openings 32a corresponding to the openings 31a. The opening 32a are arranged in parallel with one another, and each opening 32a faces the corresponding opening 31a. Accordingly, these openings can transmit light.

Accordingly, in the present embodiment, it is easy to check the condition of the seal 62 (e.g., whether or not the seal 62 is formed at an appropriate place, whether or not the seal 62 is surely cured) through the translucent portion of the bootstrap capacitor CAP. As described above, the flame region 8 of the array substrate 10, especially a region where the transistors of the shift registers 73a and 73b are arranged faces the BM 52. Therefore, the condition of the seal 62 is hardly observed from the counter substrate 50 side and is commonly not inspectable. In contrast, according to the present embodiment, the condition of the seal 62 can be easily inspected from the array substrate 10 side.

Next, a description is given on a method of producing the liquid crystal display of the present embodiment.

The liquid crystal display of the present embodiment can be produced by a common method. More specifically, the array substrate 10 and the counter substrate 50 are each individually produced by a conventional method.

Next, a step of bonding the substrates and a step of injecting liquid crystals are performed. In these steps, a method of one drop filling (ODF) or vacuum injection is commonly employed.

In the case of employing one drop filling, the following process is carried out.

First, a material of a seal (herein also referred to as a sealing material) before curing is applied to one of the array substrate 10 and the counter substrate 50 by a method such as screen printing or dispenser drawing. The applied sealing material is in a form of a closed ring. A liquid crystal material is dropped onto the substrate to which the sealing material is applied or onto the substrate to which the sealing material is not applied.

In the case of employing one drop filling, the kind of the sealing material is not particularly limited and a common sealing material may be used. Examples thereof include heat-curable sealing materials not having photocurability (hereafter, also referred to as heat-curable sealing materials), photocurable (e.g., UV-curable) sealing material not having heat curability (hereafter, also referred to as photocurable sealing materials), and photocurable (e.g., UV-curable) and heat-curable sealing materials (hereafter, also referred to as photo-heat combination type sealing materials). In particular, preferred are the photocurable sealing materials and the photo-heat combination type sealing materials. Sealing materials commonly contain an acrylic resin and/or an epoxy resin. Specific examples of the photo-heat combination type sealing materials include Photo Lex S series (SEKISUI CHEMICAL CO., LTD.) mainly containing epoxy acrylic resins.

Next, the array substrate 10 and the counter substrate 50 are bonded to each other under vacuum. From the standpoint of narrowing the flame region 8, the sealing material is positioned at a place overlapping with the BM 52. Finally, the sealing material is cured by photoirradiation and/or heat treatment. In the case of using a photo-heat combination type sealing material, light is irradiated from the array substrate 10 side. The reason for this is that the BM 52 is formed on the counter substrate 50. The sealing material is then completely cured by heat treatment. Conditions for the photoirradiation and heat treatment can be appropriately determined in accordance with the properties of the sealing material. In the case of using Photo Lec S series, for example, after exposure to UV light of about 10 J, heat treatment is performed at 120° C. for 60 minutes.

In the case of employing vacuum injection, the following process is carried out.

First, the sealing material is applied to one of the array substrate 10 and the counter substrate 50 by a method such as screen printing or dispenser drawing. The sealing material is annularly formed except for a region where a filling port is formed.

In the case of employing vacuum injection, the kind of the sealing material is not particularly limited, and a common sealing material may be used. Examples thereof include heat-curable sealing materials, photocurable sealing materials and photo-heat combination type sealing materials. In particular, preferred are heat-curable sealing materials.

Next, the array substrate 10 and the counter substrate 50 are bonded to each other. From the standpoint of narrowing the flame region 8, the sealing material is positioned at a place overlapping with the BM 52. Then, the sealing material is cured by photoirradiation and/or heat treatment. At this time, a filling port (opening) is formed at a portion where the sealing material is not applied. Next, the filling port is immersed in a liquid crystal material under vacuum, and then placed under atmospheric pressure, so that the liquid crystal material is injected between the array substrate 10 and the counter substrate 50 through the filling port. Finally, the filling port is sealed.

Commonly, in a case where a flame region of a liquid crystal panel is narrowed, the seal-coated region comes closer to the display region and the seal may be formed on the shift register. Moreover, the output transistor and the bootstrap capacitor each connected to the gate bus line are large in size. In such a case, if a photocurable sealing material or a photo-heat combination type sealing material is applied onto the output transistor and the bootstrap capacitor, light is blocked by the output transistor and the capacitor, possibly forming an uncured portion in the seal. If the uncured portion is formed, the bonding force (adhesion strength) between the array substrate and the counter substrate is lowered. Moreover, the sealing material component in the uncured portion may be diffused in the display region to lower the display quality. In other words, the possibility of defective display is increased in an end portion of the display region.

In the present embodiment, the output transistor Tr1 is kept away from the seal 62 as far as possible and made closer to the display region 7 as far as possible. Instead, the bootstrap capacitor CAP is kept away from the display region 7 as far as possible and made closer to the seal 62 as far as possible. The bootstrap capacitor CAP is arranged at a place more distant from the display region 7 (place closer to the edge 10a of the array substrate 10) and the output transistor Tr1 is arranged at a place still closer to the display region 7. The output transistor Tr1 is arranged on the display region 7 side of the bootstrap capacitor CAP and in a region between the bootstrap capacitor CAP and the display region 7. Moreover, as described above, the boot strap capacitor CAP is provided with a translucent portion. In this manner, a photocurable sealing material or a photo-heat combination type sealing material can be surely cured. As a result, lowering of the bonding force between the substrates and lowering of the display quality derived from diffusion of a sealing material component in the uncured portion into the display region can be suppressed. Additionally, the flame region 8 can be narrowed.

Providing the output transistor Tr1 with a translucent portion or dividing the output transistor Tr1 into a plurality of portions may also be considered but may increase the off-leak current due to light from the translucent portion, which is not favorable in terms of stability of the TFT properties.

In the present embodiment, the position and the width of the seal 62 are not particularly limited as long as the seal 62 is arranged in the seal-coated region 63 and the desired adhesion force is ensured. The seal 62 may not be overlapped with the bootstrap capacitor CAP as illustrated in FIG. 10, and may be overlapped with the bootstrap capacitor CAP partly or entirely as illustrated in FIG. 13. In contrast, the seal 62 is preferably formed so as not to overlap with the output transistor Tr1.

The area of the bootstrap capacitor CAP is increased by the area of the translucent portion. As described above, the seal-coated region 63 can be spread over the bootstrap capacitor CAP and the seal 62 can be arranged closer to the display region 7. Accordingly, even if the area of the bootstrap capacitor CAP is increased, the width of the flame region 8 can be narrowed.

(Embodiment 2)

A liquid crystal display of Embodiment 2 is substantially the same as the liquid crystal display of Embodiment 1 except that the structure of the bootstrap capacitor is different. FIG.

14 is a schematic plan view of a bootstrap capacitor in a liquid crystal display of Embodiment 2. FIG. 15 is a schematic cross-sectional view taken along the J-K line in FIG. 14.

Figure 14:
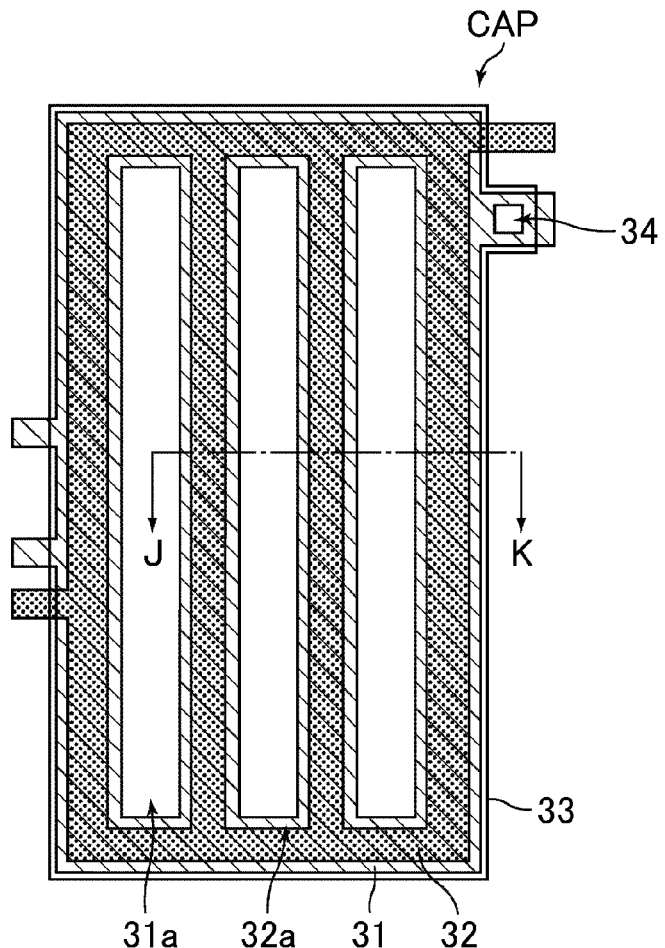
FIG. 14 is a schematic plan view of a bootstrap capacitor in a liquid crystal display of Embodiment 2.
Figure 15:
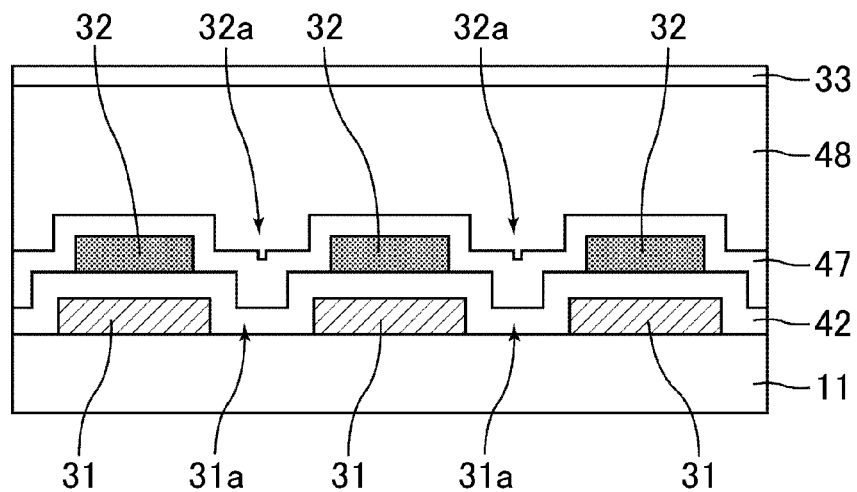
FIG. 15 is a schematic cross-sectional view taken along the J-K line in FIG. 14.

As illustrated in FIGS. 14 and 15, in the present embodiment, the bootstrap capacitor CAP further has a third electrode 33 on the insulating film 48.

The third electrode 33 is formed to cover the first electrode 31 and the second electrode 32, and is connected to the first electrode 31 through a contact hole 34 penetrating the gate insulating film 42, the insulating film 47, and the insulating film 48 on the first electrode 31. The first electrode 31 and the third electrode 33 are arranged to sandwich the second electrode 32. Accordingly, a capacitor is also formed between the second electrode 32 and the third electrode 33.

The third electrode 33 is formed of a transparent conductive film containing a transparent conductive material such as indium tin oxide (ITO) and indium zinc oxide (IZO). Light therefore can pass through the third electrode 33. The third electrode 33 may be formed of a multilayer film of such transparent conductive films. The third electrode 33 may be formed of the same conductive film as the pixel electrode 9 and/or an auxiliary capacitor electrode. In a case where the employed liquid crystal mode is a mode using a transverse electric field such as the IPS (In Plane Switching) mode and the FFS (Fringe Field Switching) mode, the third electrode 33 may be formed of the same conductive film as the common electrode.

According to the present embodiment, the capacitance of the bootstrap capacitor CAP can be increased even in a narrow region, while maintaining the effect described in Embodiment 1 (e.g., effect that the condition of the seal is easily inspected, effect that the sealing material is sufficiently cured). As a result, the size of the bootstrap capacitor CAP can be decreased, enabling to further narrow the flame region.

In a case where a liquid crystal mode using a vertical electric field (e.g., TN mode, VA mode) is employed in the present embodiment, since the counter substrate 50 has a counter electrode, preferably, the sealing material does not contain a conductive material (e.g., resin beads coated with a metal such as gold). The reason for this is that, if the sealing material contains a conductive material, leakage may occur between the counter electrode and the third electrode 31. Accordingly, in the above case, preferably, the sealing material does not contain a conductive material and the conductive material is selectively applied only onto a common transition electrode 14. For example, a carbon paste may be applied only onto the common transition electrode 14 using a syringe.

The third electrode 33 commonly does not need to have an opening formed therein but may have at least one opening and/or cutout corresponding to the translucent portion.

(Embodiment 3)

Figure 16:
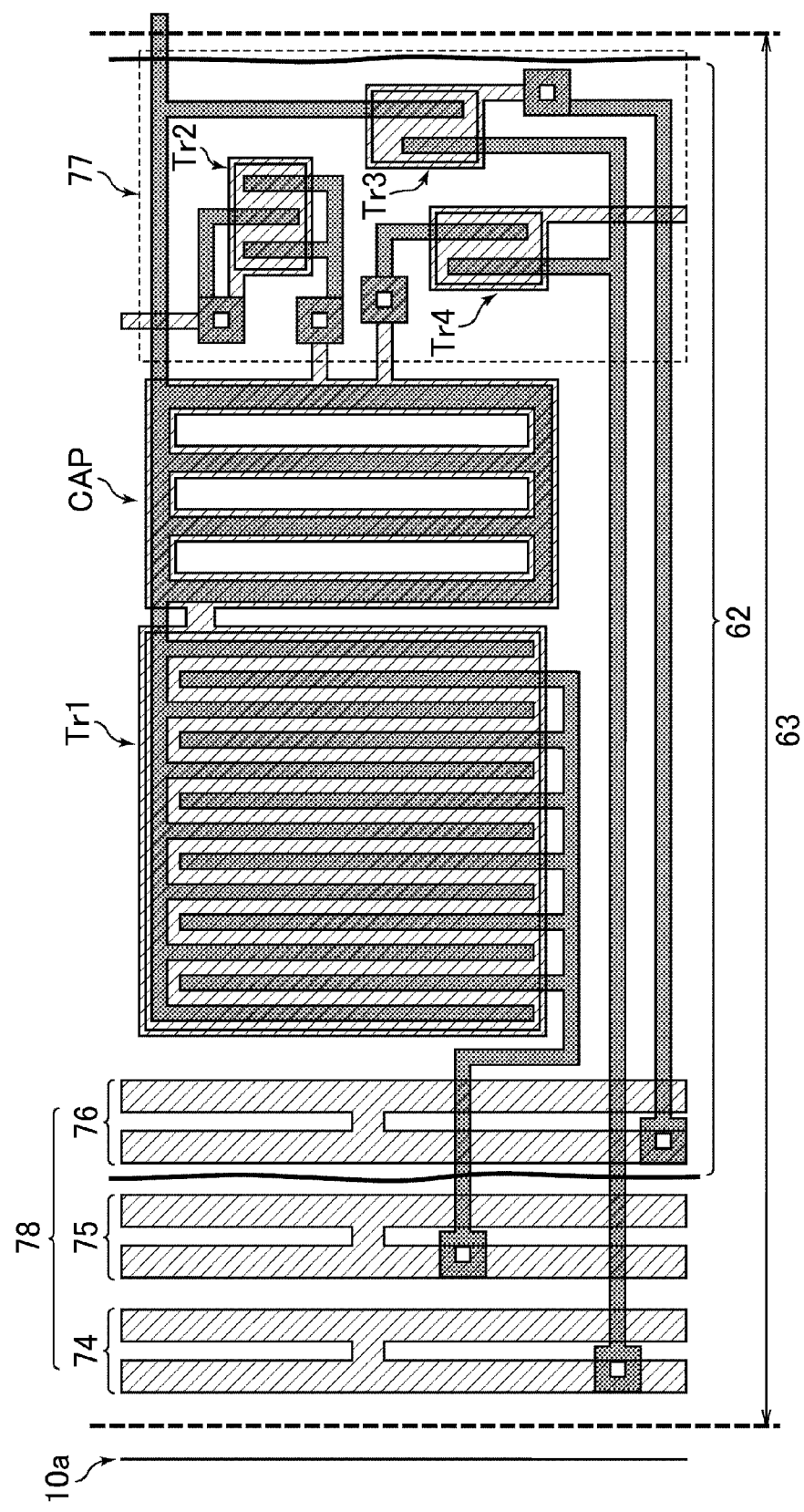
FIG. 16 is a schematic plan view illustrating a structure in a flame region of a liquid crystal display of Embodiment 3.

A liquid crystal display of Embodiment 3 is substantially the same as the liquid crystal display of Embodiment 1, except that the layout of elements in the shift register is different. FIG. 16 is a schematic plan view illustrating a structure in a flame region of a liquid crystal display of Embodiment 3.

As illustrated in FIG. 16, in the present embodiment, the output transistor Tr1 and the bootstrap capacitor CAP are arranged between the wiring group 78 and the control-element region 77.

In the present embodiment, the output transistor Tr1 is arranged on the edge 10a side of the array substrate 10 relative to the bootstrap capacitor CAP, namely in a region between the bootstrap capacitor CAP and the edge 10a. The output transistor Tr1 is arranged under the seal 62. The bootstrap capacitor CAP is arranged in a region between the output transistor Tr1 and the display region and has at least one opening (translucent portion) as described above. Covering the output transistor Tr1 with the seal 62 may form an uncured portion in the seal 62 in a region corresponding to the output transistor Tr1. However, a part on the display region side of the uncured portion is irradiated with light through the translucent portion of the bootstrap capacitor CAP so as to be stably cured. Accordingly, a sealing material component of the uncured portion is prevented from being diffused in the display region. In the present embodiment, compared to Embodiment 1, the seal 62 can be arranged closer to the display region, so that the flame region can be further narrowed.

(Embodiment 4)

Figure 22:
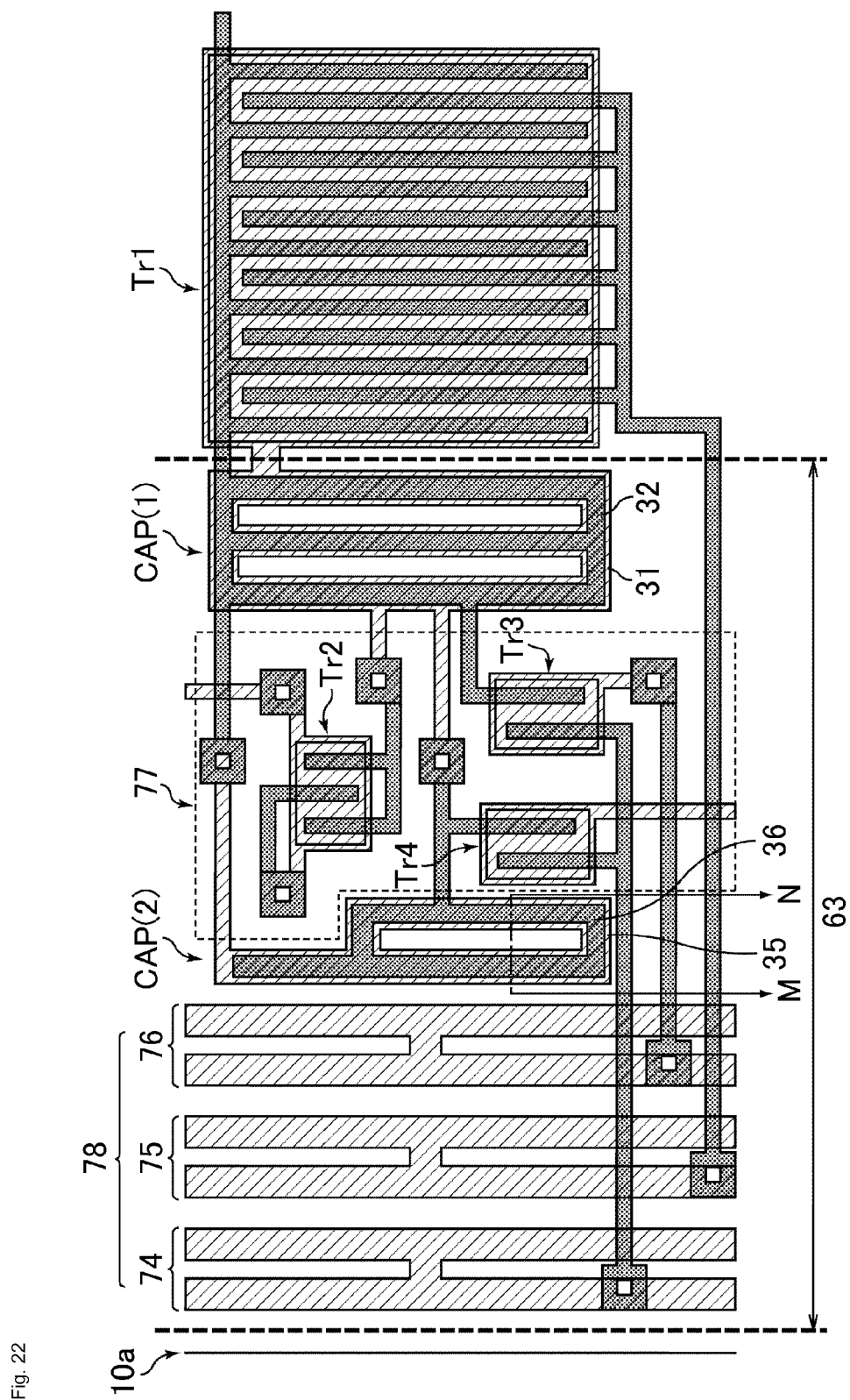
FIG. 22 is a schematic plan view illustrating a structure in a flame region of a liquid crystal display of Embodiment 4.
Figure 23:
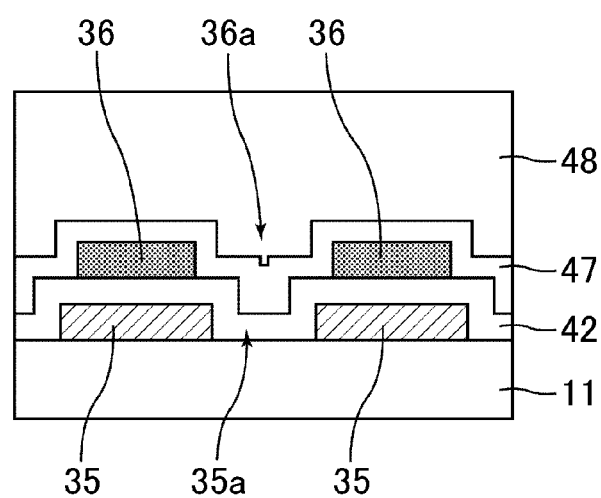
FIG. 23 is a schematic cross-sectional view taken along the M-N line in FIG. 22.

A liquid crystal display of Embodiment 4 is substantially the same as the liquid crystal display of Embodiment 1, except that the layout of elements in the shift register is different. FIG. 22 is a schematic plan view illustrating a structure in a flame region of a liquid crystal display of Embodiment 4. FIG. 23 is a schematic cross-sectional view taken along the M-N ling in FIG. 22.

As illustrated in FIG. 22, in the present embodiment, the bootstrap capacitor CAP is divided into two or more portions, for example, into a capacitor portion CAP(1) and a capacitor portion CAP(2). Each of the capacitor portions CAP(1) and CAP(2) has a translucent portion formed therein. One of the capacitor portions, for example, the capacitor portion CAP(2) is arranged at a position further distant from the display region compared to the other capacitor portion, and arranged between the wiring group 78 and the control element region 77. This enables to make the control-element region 77 closer to the display region compared to Embodiment 1, so that the distance between the edge 10a of the array substrate to the transistors Tr2 to Tr4 is increased. Accordingly, a margin is ensured for characteristic degradation of the transistors Tr2 to Tr4 due to entry of moisture from the outside.

The capacitor portion CAP(1) is different from the bootstrap capacitor CAP described in Embodiment only in the planar structure and has the same cross-sectional structure as the bootstrap capacitor CAP described in Embodiment 1. In other words, the capacitor portion CAP(1) has a first electrode 31 on an insulating substrate 11, a gate insulating film 42 on the first electrode 31, and a second electrode 32 on the gate insulating film 42. The first electrode 31 is connected to the first terminal, the gate (gate electrode) of the output transistor Tr1, and the node netA. The second electrode 32 is connected to the second terminal, the source (source electrode) of the output transistor Tr1, and the output terminal OUT.

As illustrated in FIG. 23, the capacitor portion CAP(2) has a first electrode 35 on the insulating substrate 11, a gate insulating film 42 on the first electrode, and a second substrate 36 on the gate insulating film 42. The first electrode 35 has a plurality of slit-like openings 35a formed in parallel with one another. The second electrode 36 has a plurality of slit-like openings 36a corresponding to the openings 35a. The openings 36a are arranged in parallel with one another and each opening 36a faces the corresponding opening 35a. Therefore, light can pass through these openings.

One of the electrodes 35 and 36 is connected to the first terminal, the gate (gate electrode) of the output transistor Tr1, and the node netA through the first electrode 31, and the other of the electrodes 35 and 36 is connected to the second terminal, the source (source electrode) of the output transistor Tr1, and the output terminal OUT through the second electrode 32. The positions of the electrode connected to the node netA and of the electrode connected to the output terminal OUT may be reversed between the capacitor portions CAP(1) and CAP(2).

In the capacitor portion CAP(1), the first electrode 31 of a lower layer is connected to the node netA and the second electrode 32 of an upper layer is connected to the output terminal OUT. In the capacitor portion CAP(2), the second electrode 36 of an upper layer may be connected to the node netA and the first electrode 35 of a lower layer may be connected to the output terminal OUT. The connection destination of each of the electrodes 31, 32, 35, and 36 can be appropriately selected from the output terminal OUT and the node netA in consideration of the layout of the control-element region 77.

From the standpoint of narrowing the flame region, two wirings connecting the capacitor portions CAP(1) and CAP (2) to each other are preferably arranged in a free space in the control-element region 77. In such a case, preferably, the two wirings are respectively switched between a lower electrode layer where the electrodes 31 and 35 are present and an upper electrode layer where the electrodes 32 and 36 are present in accordance with the three-dimensional wiring structure in the control-element region 77.

(Embodiment 5)

Figure 24:
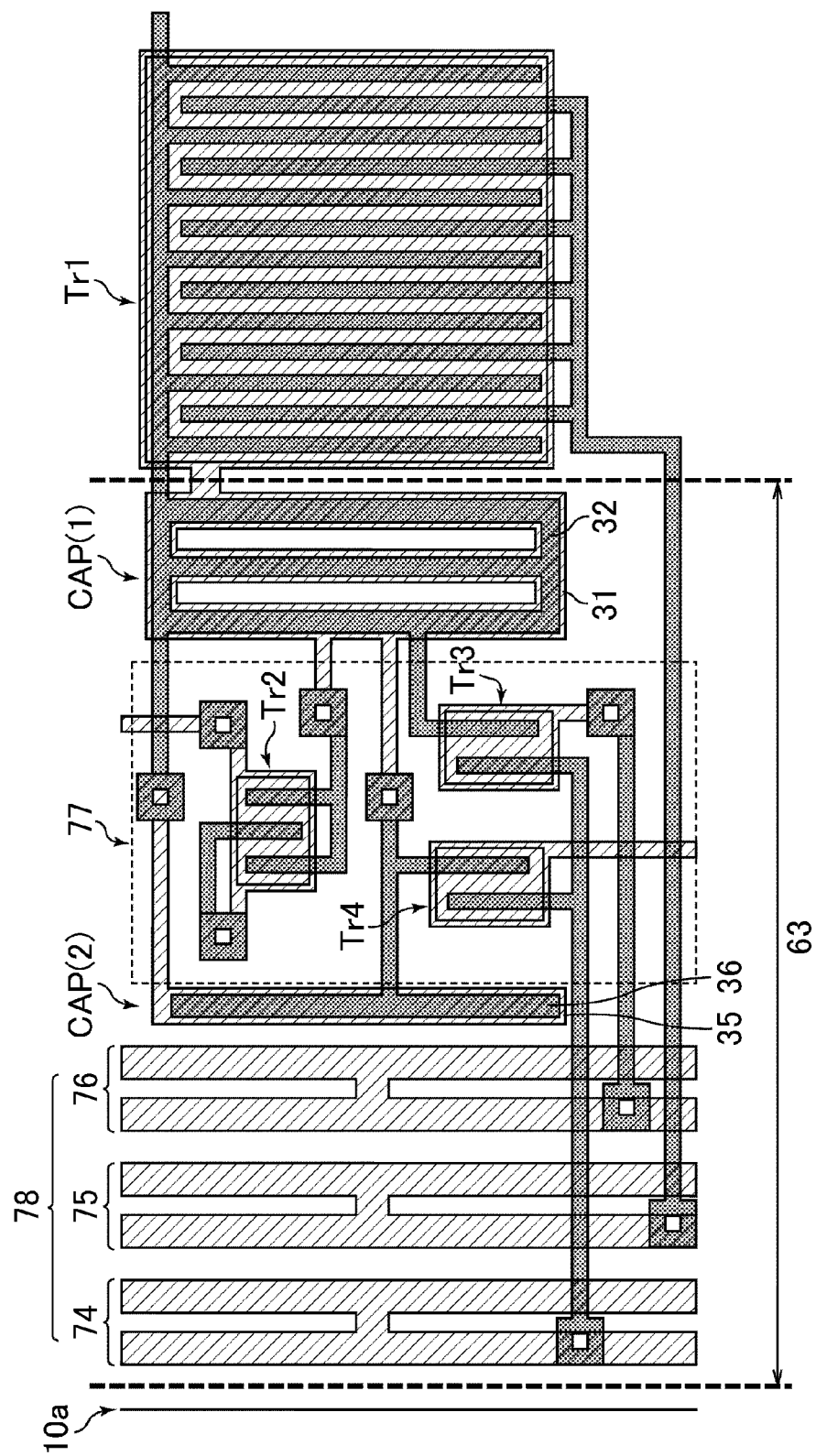
FIG. 24 is a schematic plan view illustrating a structure in a flame region of a liquid crystal display of Embodiment 5.

A liquid crystal display of Embodiment 5 is substantially the same as the liquid crystal display of Embodiment 4, except that the planar structure of the capacitor portion CAP (2) is different. FIG. 24 is a schematic plan view illustrating a structure in a flame region of a liquid crystal display of Embodiment 5.

As illustrated in FIG. 24, in the present embodiment, a translucent portion is not formed in the capacitor portion CAP(2), and an opening is not formed in the first electrode 35 and the second electrode 36 of the capacitor portion CAP(2). The present embodiment is suitable for a case where the width of each of the electrodes 35 and 36 is sufficiently thin as, for example, 10 μm or less.

(Embodiment 6)

Figure 25:
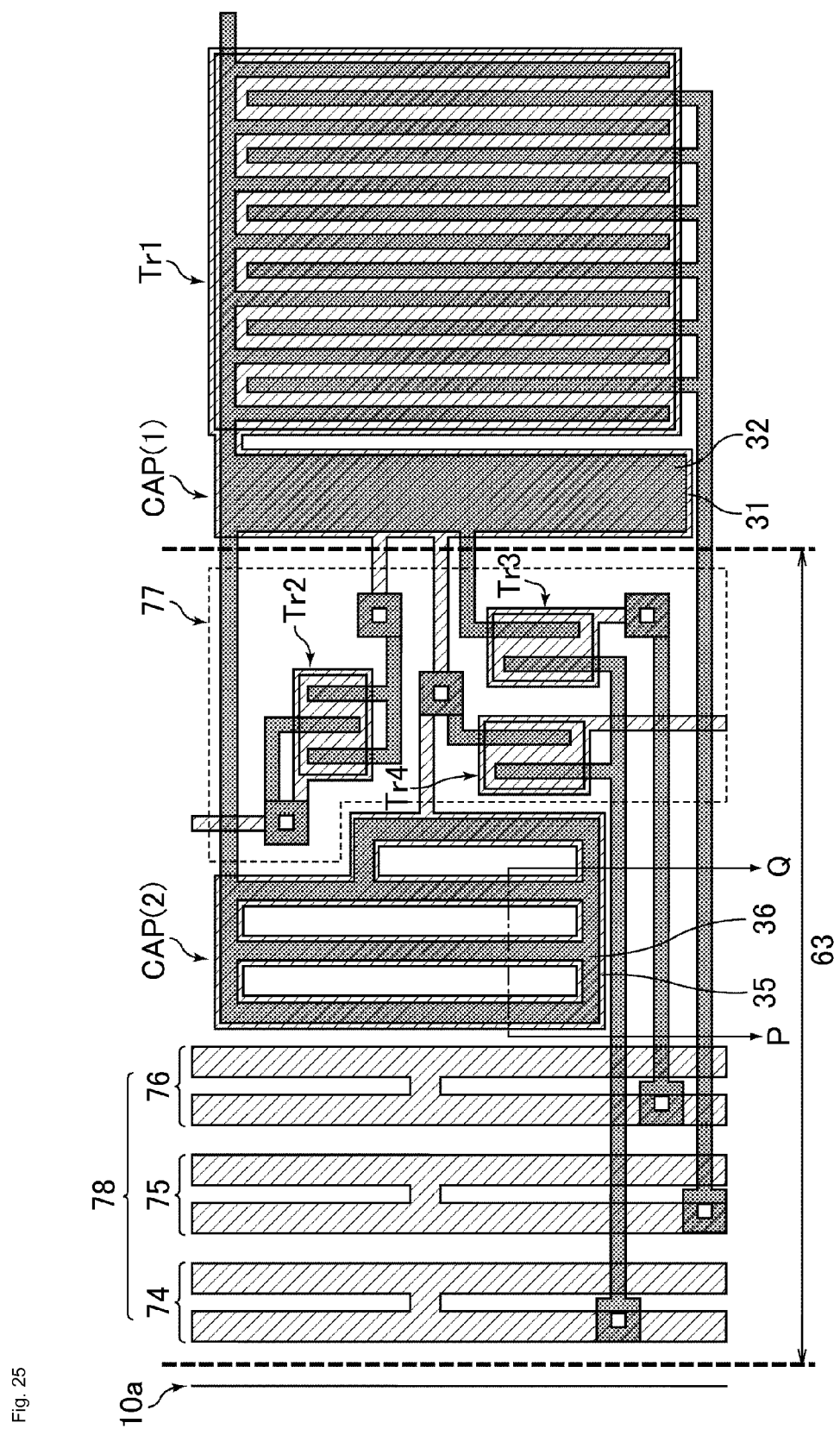
FIG. 25 is a schematic plan view illustrating a structure in a flame region of a liquid crystal display of Embodiment 6.
Figure 26:
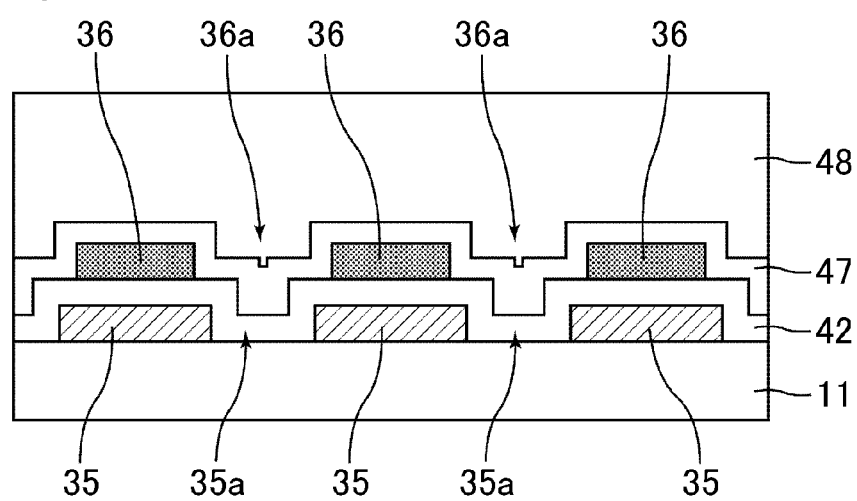
FIG. 26 is a schematic cross-sectional view taken along the P-Q line of FIG. 25.

A liquid crystal display of Embodiment 6 is substantially the same as the liquid crystal display of Embodiment 1, except that the layout of elements in the shift register is different. FIG. 25 is a schematic plan view illustrating a structure in a flame region of a liquid crystal display of Embodiment 6. FIG. 26 is a schematic cross-sectional view taken along the P-Q line in FIG. 25.

As illustrated in FIG. 25, in the present embodiment, the bootstrap capacitor CAP is divided into two or more parts, for example, into a capacitor portion CAP(1) and a capacitor portion CAP(2). The capacitor portion CAP(2) has a translucent portion formed therein but the capacitor portion CAP(1) does not have a translucent portion. The capacitor portion CAP(2) having a translucent portion formed therein is arranged at a position more distant from the display region compared to the capacitor portion CAP(1), and arranged between the wiring group 78 and the control-element region 77. This enables to make the control-element region 77 closer to the display region compared to Embodiment 1, and the distance from the edge 10a of the array substrate to the transistors Tr2 to Tr4 is increased. Accordingly, a margin is ensured for characteristic degradation of the transistors Tr2 to Tr4 due to entry of moisture from the outside.

The capacitor portion CAP(1) is different from the bootstrap capacitor CAP described in Embodiment 1 only in the planar structure and has the same cross-sectional structure as the bootstrap capacitor CAP described in Embodiment 1. In other words, the capacitor portion CAP(1) has a first electrode 31 on an insulating substrate 11, a gate insulating film 42 on the first electrode 31, and a second electrode 32 on the gate insulating film 42. The first electrode 31 is connected to the first terminal, the gate (gate electrode) of the output transistor Tr1 and the node netA. The second electrode 32 is connected to the second terminal, the source (source electrode) of the output transistor Tr1 and the output terminal OUT. Here, the first electrode 31 and the second electrode 32 do not have an opening formed therein.

As illustrated in FIG. 26, the capacitor portion CAP(2) has a first electrode 35 on the insulating substrate 11, a gate insulating film 42 on the first electrode 35, and a second electrode 36 on the gate insulating film 42. The first electrode 35 has a plurality of slit-like openings 35a formed in parallel with one another and the second electrode 36 has a plurality of slit-like openings 36a corresponding to the openings 35a. The openings 36a are arranged in parallel with one another and each opening 36a faces the corresponding opening 35a. Accordingly, light can pass through these openings.

The first electrode 35 is connected to the first terminal, the gate (gate electrode) of the output transistor Tr1 and the node netA through the first electrode 31. The second electrode 32 is connected to the second terminal, the source (source electrode) of the output transistor Tr1, and the output terminal OUT through the second electrode 32. FIG. 25 illustrates a case where the positional relationship in a vertical direction between the electrode connected to the node netA and the electrode connected to the output terminal OUT is the same between the capacitor portions CAP(1) and (2). The positional relationship may be switched as described in Embodiment 4 in accordance with the shape and/or size of the free space in the control-element region 77.

(Embodiment 7)

The liquid crystal display of Embodiment 7 is substantially the same as the liquid crystal display of Embodiment 6, except that the layout of elements in the shift register is different. FIG. 27 is a schematic plan view illustrating a structure in a flame region of a liquid crystal display of Embodiment 7.

As illustrated in FIG. 27, the positions of the output transistor Tr1 and the capacitor portion CAP(1) are switched, and the output transistor Tr1 and the control-element region 77 are arranged between the capacitor portions CAP(1) and CAP(2) in the present embodiment. This enables to make the output transistor Tr1 closer to the wiring 75 connected to the output transistor Tr1 compared to a case of Embodiment 6. Accordingly, the enough size of the capacitor portion CAP(1) is ensured, and short circuit is prevented from occurring between the capacitor portion CAP(1) and the wiring connecting the output transistor Tr1 with the wiring 75.

Figure 17:
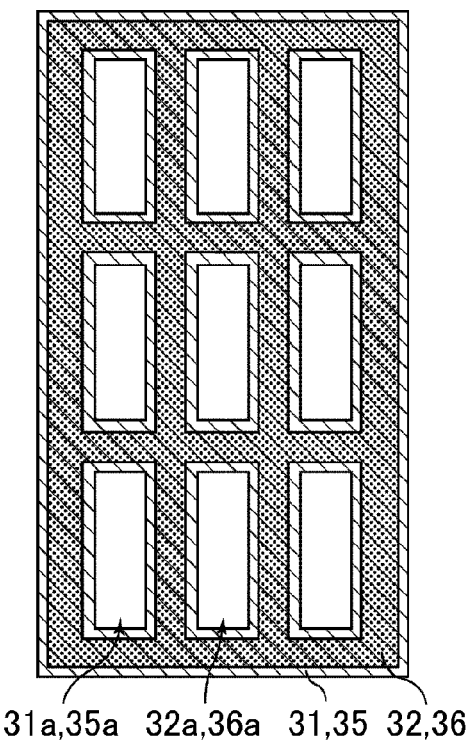
FIG. 17 is a schematic plan view of a bootstrap capacitor of each of the liquid crystal displays of Embodiments 1 to 7.
Figure 18:
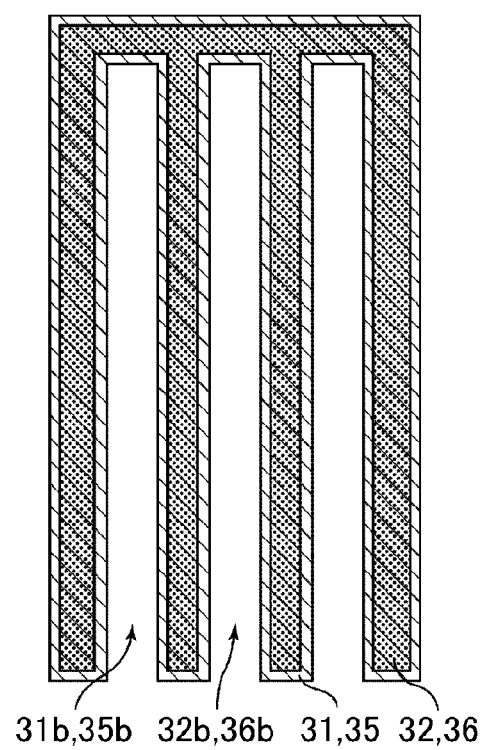
FIG. 18 is a schematic plan view of a bootstrap capacitor of each of the liquid crystal displays of Embodiments 1 to 7.
Figure 19:
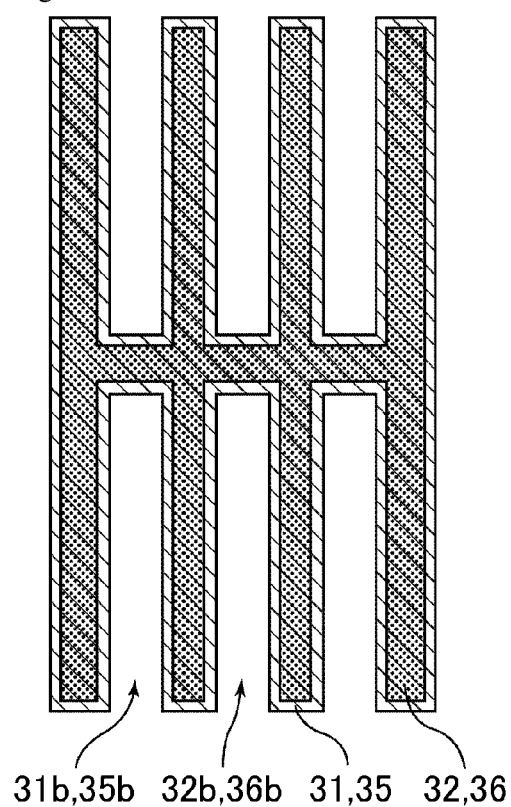
FIG. 19 is a schematic plan view of a bootstrap capacitor of each of the liquid crystal displays of Embodiments 1 to 7.

Hereafter, various modifications of Embodiments 1 to 7 are described. FIGS. 17 to 19 each are schematic plan views of the bootstrap capacitors in the liquid crystal displays of Embodiment 1 to 7. FIGS. 17 to 19 each illustrate the bootstrap capacitor CAP, the capacitor portion CAP(1), or the capacitor portion CAP(2).

In Embodiments 1 to 7, the shape and arrangement of the openings formed in the bootstrap capacitor are not particularly limited. As illustrated in FIG. 17, for example, the openings 31a, 32a, 35a, and 36a may be arranged vertically and horizontally. The first electrodes 31 and 35 each may have at least one cutout formed therein and the second electrodes 32 and 36 each may have at least one cutout corresponding to the cutout in the first electrode. For example, as illustrated in FIGS. 18 and 19, the first electrodes 31 and 35 each may have a plurality of slit-like cutouts 31b and 35b formed in parallel with one another, and the second electrodes 32 and 36 each may have a plurality of slit-like cutouts 32b and 36b corresponding to the cutouts 31b and 35b. The cutouts 32b and 36b are arranged in parallel with one another and the cutouts 32b and 36b respectively face the corresponding cutouts 31b and 36b. The bootstrap capacitor may have both the openings and cutouts formed therein. In addition, the openings and the cutouts may face one another.

The number and the size of each of the openings and the cutouts, and the width of each of the linear portions in the first and second electrodes are not particularly limited and may be appropriately determined. From the standpoint of sufficiently curing the photocurable sealing material and the photo-heat combination type sealing material, the width of each of the openings and the cutouts is preferably 5 µm or more and more preferably 10 µm or more, and the width of each of the linear portions is preferably 40 µm or less and more preferably 10 µm or less.

In Embodiments 1 to 7, a description has been given on a case where a gap is provided between the output transistor Tr1 and the bootstrap capacitor CAP or the capacitor portion CAP(1), and these components are connected by a short wiring to each other. In accordance with the positions of the seal and the seal-coated region, these components may not need to have a gap provided therebetween and may be integrally formed. For example, the gate electrode 41 and the first electrode 31 may not need to have a gap therebetween and the second electrode 32 and the teeth of the adjacent source electrode 45 may not need to have a gap therebetween. The former structure ensures the area of the translucent portion by the gap, so that the effects described in Embodiment 1 (e.g., effect that the condition of the seal is easily inspected, effect that the sealing material is sufficiently cured) can be more sufficiently exerted. The latter structure enables to further narrow the flame region.

The semiconductor material of each TFT is not particularly limited and may be appropriately determined. Examples thereof include semiconductors of group 14 elements such as silicon and oxide semiconductors. Moreover, the crystallizability of the semiconductor material of each TFT is not particularly limited, and may be monocrystalline, polycrystalline, amorphous, microcrystalline, or a crystal structure combining two or more of these. In a case where the output transistor contains amorphous silicon, however, from the standpoint of increasing the driving performance, the channel width of the output transistor and the size of the bootstrap capacitor are significantly increased. Accordingly, in a case where the output transistor contains amorphous silicon, the effects such as the effect that the condition of the seal is easily inspected and the effect that the sealing material is sufficiently cured are notably exerted. The oxide semiconductor contains preferably oxygen (O) and at least one element selected from the group consisting of indium (In), gallium (Ga), zinc (Zn), aluminum (Al), and silicon (Si), and more preferably O, In, Ga, and Zn.

In Embodiments 1 to 7, the number and the positions of the bootstrap capacitors having a translucent portion (opening and/or cutout) formed therein are not particularly limited, and may be appropriately determined. In other words, at least one bootstrap capacitor has a translucent portion. All the bootstrap capacitors may have a translucent portion formed therein, or alternatively, some of the bootstrap portions may have a translucent portion formed therein. From the standpoint of efficiently exert the above effects, preferably, all the bootstrap capacitors have a translucent portion (opening and/or cutout) formed therein.

In Embodiments 1 to 7, the kinds of the elements and the wirings in each gate driver are not particularly limited, except for the output transistor and the bootstrap capacitor, and may be appropriately determined.

In Embodiments 1 to 7, a description has been given on a liquid crystal display. The display device according to the present invention is not particularly limited to a liquid crystal display provided that the display device has a shift register including an output transistor and a bootstrap capacitor. For example, the display device may be microcapsule-type electrophoretic electronic paper or an organic or inorganic EL display.

(Embodiment 8)

The following describes Embodiment 8 related to an active matrix organic EL display.

Figure 20:
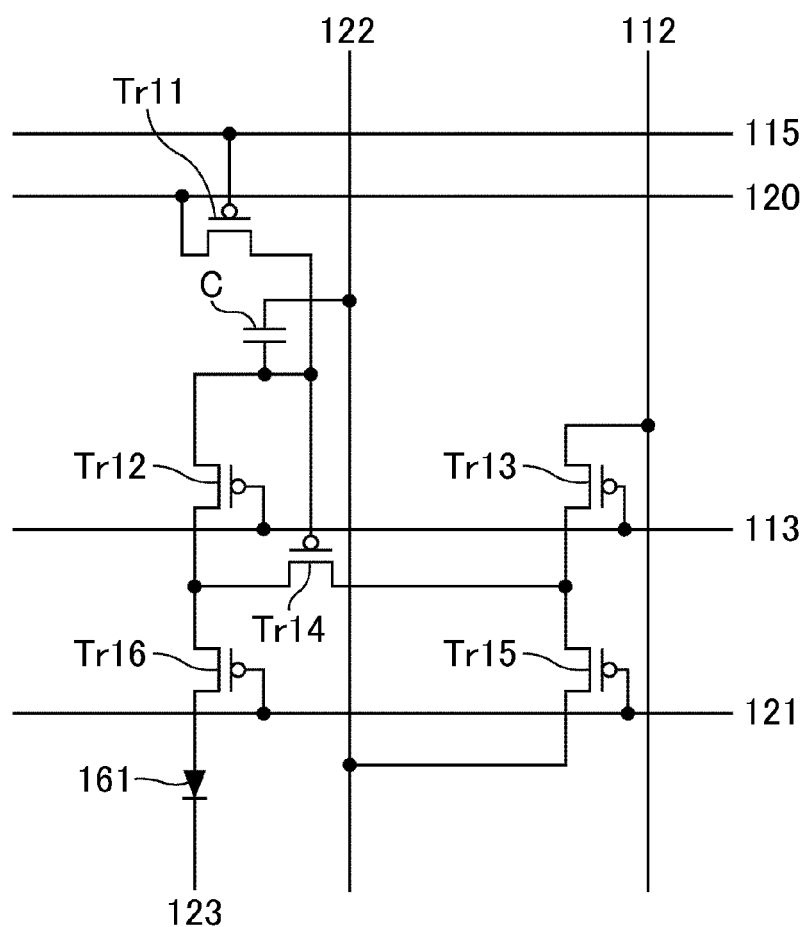
FIG. 20 is a circuit diagram illustrating a circuit configuration of a unit pixel (pixel or sub pixel) included in an active-matrix EL display of Embodiment 8.

FIG. 20 is a circuit diagram illustrating a circuit structure of a unit pixel (pixel or sub pixel) included in the active matrix organic EL display of Embodiment 8. As illustrated in FIG. 20, the pixel circuit is provided with six pixel transistors Tr11 to Tr16 and one organic EL element 161. The transistor Tr13 corresponds to the second pixel transistor in Embodiment (C), and the transistor Tr16 corresponds to the pixel transistor in Embodiment (B) and the first pixel transistor in Embodiment (C).

The transistor Tr11 discharges the charge of a capacitor C through a wiring (hereafter, also referred to as an initialization voltage line) 120 set to a predetermined potential in response to a signal (initialization signal) supplied from a bus line (hereafter, also referred to as a initialization signal line) 115. As a result, the gate voltage of the transistor Tr14 is initialized.

The transistor Tr12 compensates variation in the threshold voltage of the transistor Tr14.

The transistor Tr13 performs switching of a data signal supplied from a data bus line 112 in response to a gate signal (scanning signal) from a gate bus line 113. The gate bus line 113 corresponds to the first bus line in Embodiment (C). The data signal is a signal generated in a display or a data driver based on the image signal supplied from the outside and contains gradation data of a unit pixel.

The transistor Tr14 controls the current flowing into an organic EL element 161 in response to the data signal supplied through the transistor Tr13.

The transistor Tr15 performs switching of the current flowing into the transistor Tr14 from a wiring (hereafter, also referred to as a cathode-side power source line) 122 set to a predetermined potential in response to a signal supplied from a bus line (hereafter, also referred to as a light emission control line) 121. The light emission control line 121 corresponds to the bus line in Embodiment (B).

The transistor Tr16 performs switching of the current flowing into the organic EL element 161 through the transistor Tr 14 in response to a signal supplied from the light emission control line 121.

The capacitor C is provided so as to maintain the gate voltage impressed on the transistor Tr14.

The organic EL element 161 emits light at a luminance corresponding to the current supplied through the transistor Tr15, the transistor Tr14, and the transistor Tr16. The cathode of the organic EL element 161 is connected to the drain of the transistor Tr16. The anode of the organic EL element 161 is connected to a wiring (hereafter, also referred to as an anode-side power supply line) 123 set to a predetermined potential. A common element may be used as the organic EL element 161.

In the present embodiment, a description has been given on a case where p-channel TFTs are used as the transistors Tri1 to Tr6.

Figure 21:
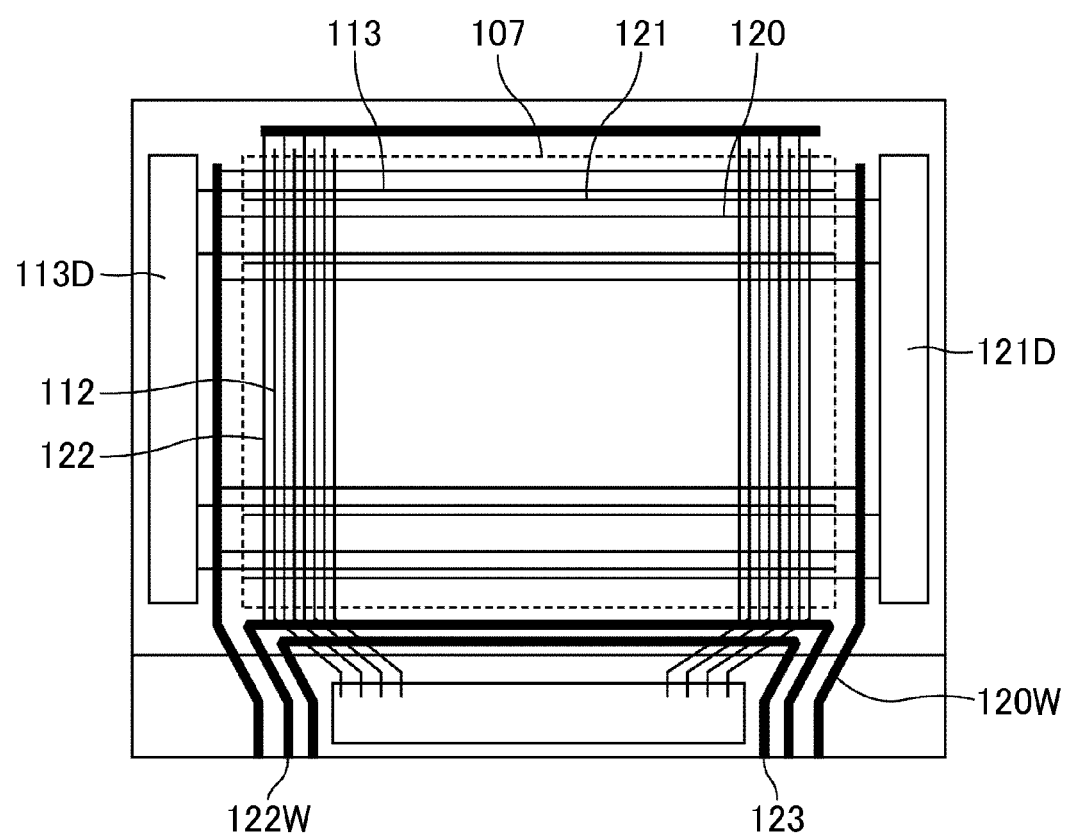
FIG. 21 is a schematic plan view of an organic EL substrate included in an active-matrix organic EL display of Embodiment 8.

FIG. 21 is a schematic plan view of an organic EL substrate included in the active matrix organic EL display of Embodiment 8. The organic EL substrate corresponds to the first substrate. As illustrated in FIG. 21, the initialization voltage lines 120, the gate bus lines 113, and the light emission control lines 121 are running in the row direction. The cathode-side power supply lines 122 and the data bus lines 112 are running in the column direction. The cathode-side power supply lines 122 may be mutually connected to one another in the display region 107.

Outside the display region 107, a driving circuit for the gate bus lines 113 and a driving circuit for the light emission control lines 121 are provided. For example, as illustrated in FIG. 21, a driving circuit 113D for the gate bus lines 113 is provided on the left side of the display region 107 and a driving circuit 121D for the light emission control lines 121 is provided on the right side of the display region 107. Alternatively, driving circuits for the gate bus lines 113 may be provided on both right and left sides of the display region 107 and driving circuits for the light emission control lines 121 may be provided on the outer sides (i.e., at positions more distant from the display region 107) of the driving circuits for the gate bus lines 113. In such a case, the light emission control lines 121 pass through the driving circuits for the gate bus lines 113 to be connected to the driving circuits for the light emission control lines 121.

Though not illustrated in FIG. 21, the initialization signal lines 115 are running in the row direction in the same manner as the bus lines (e.g., the initialization voltage lines 120) and each may be connected to the gate bus line 113 for pixels of the adjacent row or a driving circuit (hereafter, also referred to as a initialization signal line-driving circuit) provided only for the initialization signal lines 115.

The above driving circuits each may include a shift register configured by cascade-connecting a plurality of unit circuits.

The initialization voltage lines 120 and the cathode-side power supply lines 122 are respectively connected to a wiring (trunk wiring for initialization voltage lines) 120W and a wiring (trunk wiring for cathode-side power supply lines) 122W outside the display region 107. Anodes of all the organic EL elements 161 are mutually connected to one another in the display region 107 and connected to the anode-side power supply line 123 outside the display region 107.

Next, a description is given on a method of driving the active matrix organic EL display of the present embodiment.

Pixels of each row pass through three periods (stages) including an initialization period, a writing period, and a light-emission period in each flame.

In the initialization period, the transistor Tr11 is turned ON by an ON signal supplied from the initialization signal line 115 and the charge of the capacitor C is discharged through the initialization voltage line 120. This initializes the gate voltage of the transistor Tr14.

Next, in the writing period, gradation data supplied from the data bus line 112 is written to the transistor Tr14 in response to the ON signal supplied from the gate bus lines 113. At this time, the gate voltage of the transistor Tr14 is lower than the voltage applied from the data bus line 112 by the value of the threshold voltage of the transistor Tr14. The charge corresponding to the gate potential of the transistor Tr14 is charged to the capacitor C.

In the light emission period, the transistor Tr15 and the transistor Tr16 are turned ON by the ON signal supplied from the light emission control line 121 and the current corresponding to the gate voltage of the transistor Tr14 is supplied to the organic EL element 161. As a result, the organic EL element 161 emits light.

The above three stages are repeated in each row to perform display.

Common organic EL elements are easily deteriorated by moisture and oxygen. Therefore, for protection of the organic EL element 161, a counter substrate corresponding to the second substrate and facing the organic EL substrate is provided and a seal is provided between the organic EL substrate and the counter substrate. In this manner, a space between the substrates is sealed. Exemplary materials of the seal include frit glass. Moreover, from the standpoint of enhancing the adhesion strength of the substrates, the seal may include a portion formed of a cured frit glass and a portion formed of a cured resin. The resin portion is provided any one or both of the inside and the outside (i.e., display region side and edge side of the substrate) of the frit glass portion. Specific examples of the resin include photocurable and/or heat curable epoxy resins, photocurable and/or heat-curable acrylic resins, and compositions containing such resins.

The shift register in the display device according to the present invention can be applied to the driving circuit for the gate bus lines 113, the driving circuit for the light emission control lines 121, and the driving circuit for the initialization signal lines. In other words, these driving circuits may include an output transistor and a bootstrap capacitor having a translucent portion (opening and/or cutout) formed therein as described in Embodiments 1 to 7. Therefore, also in the present embodiment, the effects described in Embodiment 1 (e.g., the effect that the condition of the seal is easily inspected, the effect that the sealing material is sufficiently cured) can be exerted.

Embodiments 1 to 8 may be combined with one another. For example, bootstrap capacitors different in the structure may be formed in one shift register, or the structure of bootstrap capacitors may be different for each shift register.

Modification examples of Embodiment 1 to 7 may be employed in Embodiment 8. For example, in Embodiment 8, the width of each opening and cutout provided in the bootstrap capacitor may be 5 μm or more or 10 μm or more, and the width of each linear portion may be 40 μm or less or 10 μm or less. The semiconductor material of each TFT is not particularly limited, and examples thereof include semiconductors of group 14 elements such as silicon and oxide semiconductors. Moreover, the crystallizability of the semiconductor material of each TFT is not particularly limited, and may be monocrystalline, polycrystalline, amorphous, microcrystalline, or a crystal structure combining two or more of these. From the same standpoint as in Embodiments 1 to 7, the output transistor may contain amorphous silicon in Embodiment 8. The oxide semiconductor contains preferably oxygen (O) and at least one element selected from the group consisting of In, Ga, Zn, Al, and Si, and more preferably O, In, Ga, and Zn. In Embodiment 8, the number and the position of the bootstrap capacitors having a translucent portion (opening and/or cutout) formed therein are not particularly limited. All the bootstrap capacitors may have a translucent portion formed therein, or alternatively, some of the bootstrap portions may have a translucent portion formed therein.

REFERENCE SIGNS LIST

1: Liquid crystal panel
2: Display portion
3: Pixel
4: Pixel TFT
5: Driving circuit (source driver) for source bus lines
6a, 6b: Driving circuit (gate driver) for gate bus lines
7, 107: Display region
8: Flame region
9: Pixel electrode
10: Array substrate
10a: Edge
11: Insulating substrate 12, S1 to Sm: Source bus line
13, 113, G1 to Gn: Gate bus line
14: Common transition electrode
16: Common trunk wiring
17: Common bus line
18, 19: Lead wiring
25: Input wiring
26, 27, 28, 29, 30: Terminal
31, 35: First electrode
31a, 32a, 35a, 36a: Opening
31b, 32b, 35b, 36b: Cutout
32, 36: Second electrode
33: Third electrode
34: Contact hole
41: Gate electrode
42: Gate insulator
43: i layer (semiconductor active layer)
44: n+ layer
45: Source electrode
46: Drain electrode
47, 48: Insulating film
50: Counter substrate
51: Insulating substrate
52: Black matrix (BM)
61: Liquid crystal layer
62: Seal
63: Seal-coated region
71: Pixel array
72: Display control circuit
73a, 73b: Sift register
74 to 76: Wiring
77: Control element region
78: Wiring group
112: Data bus line
113D: Driving circuit for gate bus lines
115: Initialization signal line
120: Initialization voltage line
120W: Trunk wiring for initialization voltage
121: Light emission control line
121D: Driving circuit for light emission control line
122: Cathode-side power supply line
122W: Trunk wiring for cathode-side power supply line
123: Anode-side power supply line
161: Organic EL element
Pij: Pixel circuit
SR1 to SRn: Unit circuit
INa, INb: Input terminal
CKA, CKB: Clock terminal
VSS: Power supply terminal
OUT: Output terminal
Tr1 to Tr4, Tr11 to Tr16: Transistor
CAP: Bootstrap capacitor
CAP(1), CAP(2): Capacitor portion
C: Capacitor

The invention claimed is:
1. A display device comprising:
a first substrate;
a second substrate facing the first substrate; and
a seal provided between the first substrate and the second substrate,
wherein the first substrate includes an insulating substrate, a shift register monolithically formed on the insulating substrate, and a plurality of bus lines,
the shift register includes a plurality of cascade-connected unit circuits,
the plurality of unit circuits each include a clock terminal receiving a clock signal, an output terminal connected to a corresponding bus line and outputting an output signal, a transistor having one of a source and a drain connected to the clock terminal and the other of the source and the drain connected to the output terminal, and a capacitor having a first terminal connected to a gate of the transistor and a second terminal connected to the output terminal,
the capacitor includes a first electrode, an insulating layer on the first electrode, and a second electrode on the insulating layer, and
at least one of the plurality of unit circuits has the first electrode provided with at least one of a first cutout and a first opening, and the second electrode provided with at least one of a second cutout and a second opening facing the at least one of the first cutout and the first opening.

2. The display device according to claim 1, wherein the seal contains a cured substance of a photocurable material.

3. The display device according to claim 2, wherein the material further has heat-curability.

4. The display device according to claim 1,
wherein the transistor is arranged in a region between the capacitor and a display region of the first substrate, and
the seal is not arranged over the transistor.

5. The display device according to claim 1,
wherein the capacitor is arranged in a region between the transistor and a display region of the first substrate,
the transistor is covered with the seal, and
at least part of the capacitor is arranged under the seal.

6. The display device according to claim 1,
wherein the capacitor further includes a second insulating layer on the second electrode, and a transparent electrode on the second insulating layer, and
the transparent electrode is connected to the first electrode.

7. The display device according to claim 1,
wherein the first substrate includes a plurality of pixel circuits in a display region,
the plurality of pixel circuits each include a pixel transistor and a pixel electrode connected to the pixel transistor, and
the plurality of bus lines are respectively connected to corresponding gates of a plurality of the pixel transistors.

8. The display device according to claim 1,
wherein the first substrate includes a plurality of pixel circuits provided in a display region,
the plurality of pixel circuits each include a pixel transistor and an electroluminescence element connected to the pixel transistor, and
the plurality of bus lines are respectively connected to corresponding gates of a plurality of the pixel transistors.

9. The display device according to claim 1,
wherein the plurality of bus lines are a first plurality of bus lines,
the first substrate includes a plurality of pixel circuits provided in a display region and a plurality of data bus lines,
the plurality of pixel circuits each include a first pixel transistor, a second pixel transistor connected to a corresponding data bus line, and an electroluminescence element connected to the first pixel transistor, and
the first plurality of bus lines are respectively connected to corresponding gates of a plurality of the second pixel transistors.

10. The display device according to claim 1,
wherein the transistor includes an oxide semiconductor.

11. The display device according to claim 10, wherein the oxide semiconductor contains indium (In), gallium (Ga), zinc (Zn), and oxygen (O).

\* \* \* \* \*